United States Patent [19]
Momma et al.

[11] Patent Number: 5,801,554
[45] Date of Patent: Sep. 1, 1998

[54] SEMICONDUCTOR INTEGRATED CIRCUIT DEVICE FOR HANDLING LOW AMPLITUDE SIGNALS

[75] Inventors: Atsuko Momma, Hamura; Miki Matsumoto, Ome; Kanji Oishi, Koganei, all of Japan

[73] Assignee: Hitachi, Ltd., Tokyo, Japan

[21] Appl. No.: 674,917

[22] Filed: Jul. 3, 1996

[30] Foreign Application Priority Data

Jul. 6, 1995 [JP] Japan ................... 7-194229

[51] Int. Cl.⁶ ................... H03K 5/135; H03K 19/0185
[52] U.S. Cl. ................... 327/89; 327/77; 327/96; 327/162; 327/88; 326/81; 365/189.05
[58] Field of Search ................... 327/78, 77, 72, 327/66, 65, 56, 53, 52, 333, 162, 141, 76, 64, 88, 89, 96, 81; 326/81, 80, 62; 330/261, 310, 311; 365/189.05, 205, 207, 208

[56] References Cited

U.S. PATENT DOCUMENTS

| 4,288,706 | 9/1981 | Reese et al. | 327/389 |
|---|---|---|---|
| 4,785,206 | 11/1988 | Hoshi | 327/77 |
| 5,019,729 | 5/1991 | Kimura et al. | 326/71 |
| 5,256,984 | 10/1993 | Lee | 330/261 |
| 5,268,872 | 12/1993 | Fujii et al. | 327/77 |
| 5,285,115 | 2/1994 | Tsuji | 327/77 |

OTHER PUBLICATIONS

B. Gunning et al., "WP 3.7: A CMOS Low–Voltage–Swing Transmission–Line Transceiver", ISSCC 92/ Session 3/ High–Performance Circuits/ Paper WP 3.7, 1992 IEEE Int'l Solid-State Circuits Conference, pp. 58–59.

Primary Examiner—Timothy P. Callahan
Assistant Examiner—Terry L. Englund
Attorney, Agent, or Firm—Antonelli, Terry, Stout & Kraus, LLP

[57] ABSTRACT

A semiconductor integrated circuit device is provided having a low-amplitude input/output interface for inputting or outputting an input/output signal synchronously with a clock signal and transferring the input/output signal with an amplitude corresponding to a power supply voltage to or from an external command unit. A first differential circuit to be practically continuously operated is used as an input circuit for receiving a clock signal supplied from an external clock unit. In addition, a second differential circuit is provided which is intermittently operated in accordance with the clock signal to sample an input signal in accordance with an internal clock signal generated by the first differential circuit while the second differential circuit is operated and holds the sampled signal while the second differential circuit is not operated. This second differential circuit is used as an input circuit for receiving a low-amplitude input signal inputted synchronously with the clock signal.

12 Claims, 14 Drawing Sheets

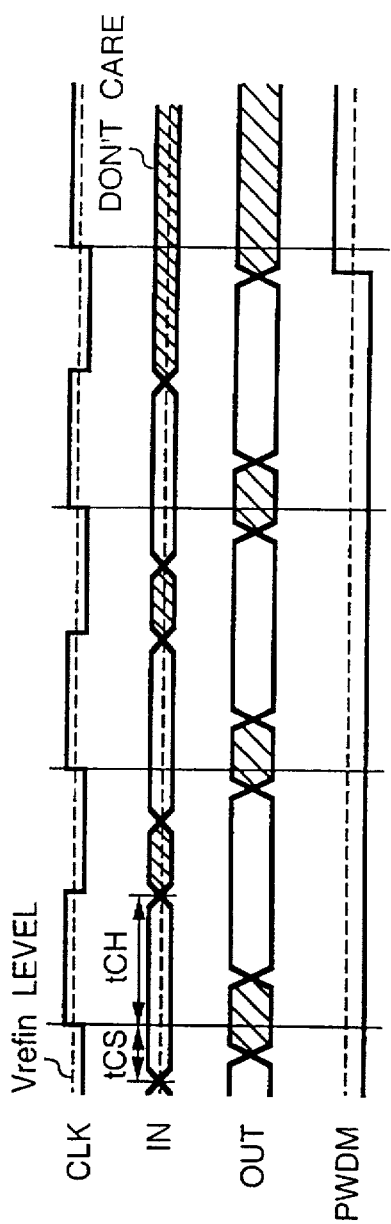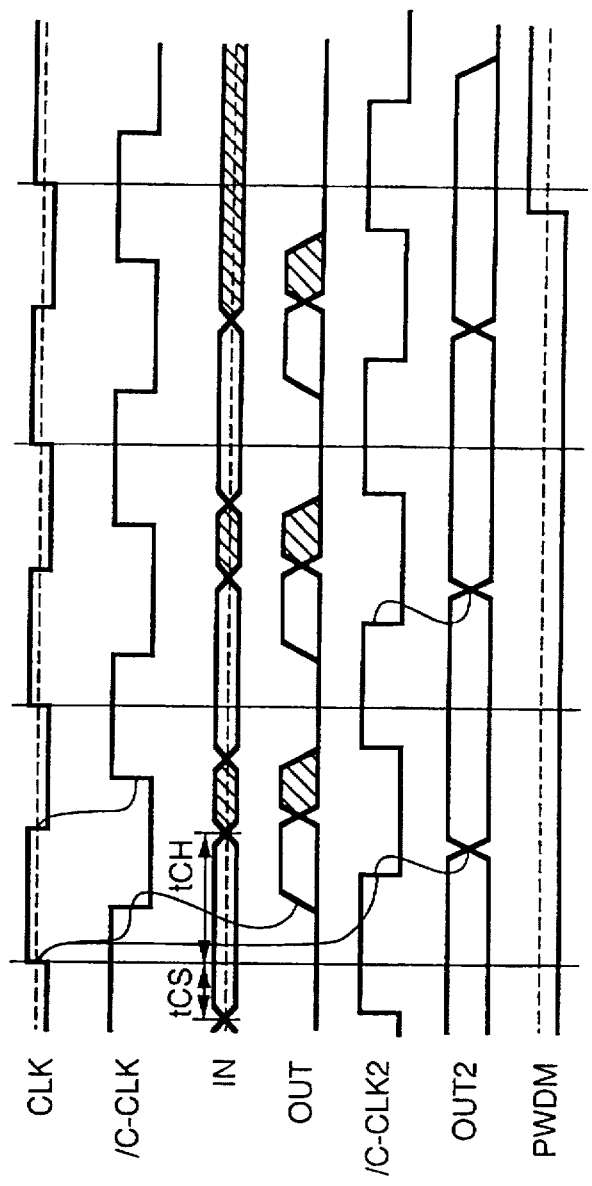
FIG. 5(A)
FIG. 5(B)

SEMICONDUCTOR INTEGRATED CIRCUIT DEVICE FOR HANDLING LOW AMPLITUDE SIGNALS

BACKGROUND OF THE INVENTION

The present invention relates to a semiconductor integrated circuit device, particularly to an arrangement effectively used for an interface for a small signal in a semiconductor integrated circuit device such as a synchronous dynamic RAM (Random Access Memory) in which a signal is input or output synchronously with a clock signal.

Information processing devices such as personal computer or work stations typically use the so-called bus circuit in which a plurality of information processing units are connected to one transmission line in parallel to transfer information to and from one other. A GTL (Gunning Transceiver Logic) can be used to decrease the power consumption of the bus circuit. The GTL decreases power consumption by decreasing the signal amplitude on a bus line to ½ or less compared to the conventional TTL (Transistor-Transistor Logic) level. That is, a terminating voltage Vt of the bus circuit is set to a small value such as +1.2 V and a receiving circuit uses a differential amplifier having a reference voltage Vref such as 0.8 V. Thereby, a high level and a low level conveyed to a signal transmission line is set to 1.2 V corresponding to the terminating voltage Vt and 0.4 V according to a voltage drop due to an on resistance of an output MOSFET. Such a GTL is described in the paper of "ISSCC (International Solid State Circuit Conference), Feb. 19, 1992, pp. 58–59".

SUMMARY OF THE INVENTION

The inventor of the present application studied a semiconductor integrated circuit device such as a dynamic RAM having an interface which can be applied to decrease the signal amplitude in a bus circuit so as to represent the GTL. Though the GTL uses a differential input circuit, it has a problem that the current consumption increases at an input interface section because the circuit continuously requires direct current.

It is an object of the present invention to provide a semiconductor integrated circuit device comprising a low-power interface for a low-amplitude input. The above and other objects and novel features of the present invention will become more apparent from the description of the present specification and the accompanying drawings.

The outline of a typical embodiment of the present invention among those disclosed in the present application is briefly described below. That is, a semiconductor integrated circuit device is provided having a low-amplitude input/output interface in which a signal is input or output synchronously with a clock signal. The signal has any amplitude which is decreased for a power supply voltage and is transferred to and from an external unit. An input circuit captures a clock signal supplied from an external unit through a differential circuit which is practically continuously operated. Another differential circuit is intermittently operated in accordance with the clock signal for an input circuit for receiving a low-amplitude input signal inputted synchronously with the clock signal. A a captured internal signal is sampled in accordance with the internal clock signal while the differential circuit is operated, and the sampled signal is held while the differential circuit is not operated.

The above-described means makes it possible to greatly decrease power consumption because it is possible to intermittently operate many input circuits excluding input circuits which must continuously be operated.

BRIEF DESCRIPTION OF THE DRAWINGS

FIGS. 5(A) and 5(B) are timing charts for explaining operations of an input circuit of the present invention.

DESCRIPTION OF THE PREFERRED EMBODIMENTS

Figure 1:
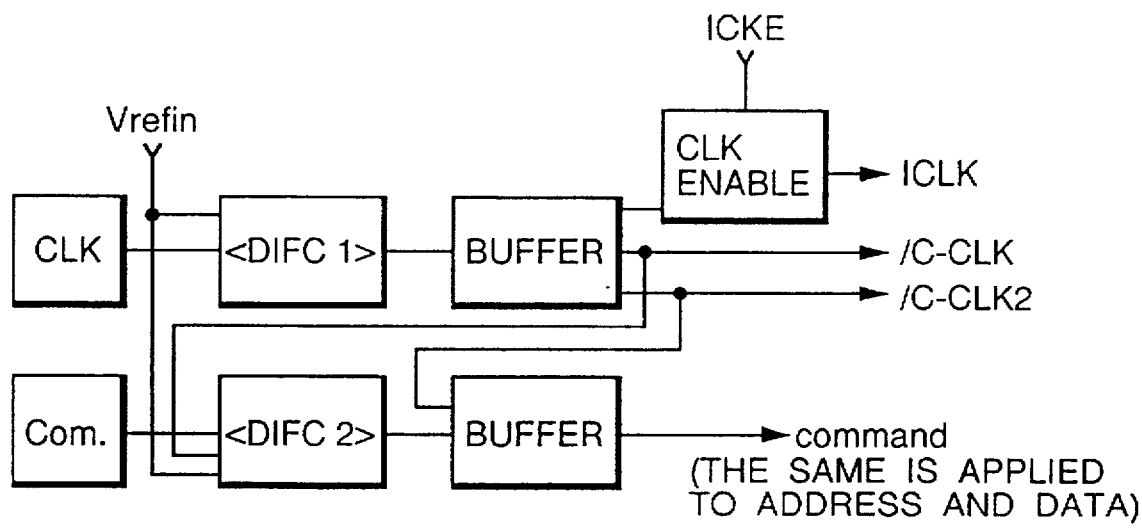
FIG. 1 is a schematic block diagram showing an embodiment of an input circuit of a semiconductor integrated circuit device of the present invention.

FIG. 1 shows a schematic block diagram of an embodiment of an input circuit of a semiconductor integrated circuit device of the present invention. The semiconductor integrated circuit device of this embodiment receives a control signal (command) from an external terminal Com synchronously with a clock signal supplied from an external terminal CLK. Though not illustrated in FIG. 1, a semiconductor integrated circuit device for receiving an address signal (Address) and data (Data) as other input signals receives the address signal and the data synchronously with a clock signal similarly to the above circuit device.

An input signal input from the above external terminal is a low-amplitude signal whose amplitude is decreased for a power supply voltage. Though not restricted, the GTL signal is an example of the low-amplitude signal. In addition to the GTL signal, any signal is accepted as long as the amplitude of the signal is decreased for a power supply voltage.

To capture the (external) low-amplitude clock signal CLK supplied from an external unit other than a semiconductor integrated circuit device, the first input circuit DIFC1 is used. The input circuit DIFC1 uses a differential amplifier which is practically continuously operated. The low-amplitude clock signal is supplied to one input of the differential amplifier and a reference voltage Vrefin practically set to an intermediate value is supplied to the other input of the differential amplifier. The input circuit DIFC1 detects whether the (external) clock signal CLK is high-level or low-level for the reference voltage Vrefin, amplifies the clock signal CLK, and generates a high-level or low-level internal signal. This internal signal is captured by internal circuits through a buffer circuit Buffer.

One of the input circuits, though not restricted, is a clock enable circuit (CLK enable) for generating an internal (signal) ICLK by receiving an output signal of the buffer circuit Buffer and an internal clock enable signal ICKE captured through another circuit (not shown) similar to the input circuit DIFC1. The amplitude of an internal clock signal is assumed to be larger than the amplitude of an external clock signal. Other input circuits are the second input circuit DIFC2 for receiving a control signal (external input signal) from the external terminal Com synchronously with a clock signal and its buffer circuit Buffer. That is, one of the internal clock signals /C-CLK output from the buffer circuit Buffer is used to intermittently operate the second input circuit DIFC2 and other internal clock signals /C-CLK2 are used for sampling and holding operations by the buffer circuit Buffer. As described above, it is possible to greatly decrease power consumption correspondingly to its pulse duty because the second input circuit DIFC2 is intermittently operated.

Figure 2:
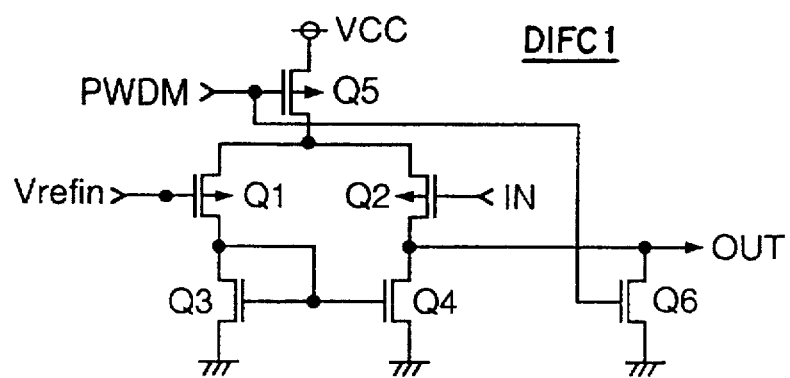
FIG. 2 is a circuit diagram showing an embodiment of the input circuit DIFC1 in FIG. 1.

FIG. 2 shows a circuit diagram of an embodiment of the first input circuit DIFC 1. In the case of the drawings in the present application, a P-channel MOSFET is discriminated from an N-channel MOSFET because the channel portion (substrate gate portion) of the P-channel MOSFET is provided with an arrow. Moreover, to prevent the drawings from being complicated, circuit symbols added to circuit devices in each drawing are duplicated. However, each symbol serves to realize a discrete circuit function.

The reference voltage Vrefin and a small-amplitude input signal (internal clock signal) IN, which corresponds to the clock signal for external terminal CLK, are supplied to P-channel MOSFETs Q1 and Q2 brought under a differential mode respectively. A current-mirror-mode active load circuit comprising N-channel MOSFETs Q3 and Q4(load circuit) is set between the drain side of the differential MOSFETS Q1 and Q2 and the ground potential of the circuit. Moreover, a current-source MOSFET Q5 (current source circuit) comprising the P-channel type is set between a source used for the differential MOSFETs Q1 and Q2 in common and a power supply voltage VCC. Though a CMOS inverter circuit or the like is properly used as a buffer circuit Buffer, it is not illustrated in FIG. 1. The amplitude of an output signal OUT (internal clock signal) is larger than that of an input signal (internal clock signal) IN.

The semiconductor integrated circuit device of this embodiment is provided with the so-called low power consumption mode for operating only necessary circuits during an inoperative period (standby state or sleep state) and bringing other circuits into an inoperative state so as to turn off the current-source MOSFET Q5 by a control signal PWDM for designating the low power consumption mode. That is, in the low power consumption mode, input of a clock signal is also stopped to decrease the power consumption of the input circuit DIFC1. To prevent an output of the input circuit DIFC1 from becoming a floating state when the low power consumption mode is set, an N-channel MOSFET Q6 is supplied with the control signal PWDM also supplied to the gate of the MOSFET Q5. When the current-source MOSFET Q5 is turned off by the control signal PWDM, an output signal of the input circuit DIFC1 is fixed to the ground potential of the circuit in accordance with the on-state of the MOSFET Q6.

Figure 3:
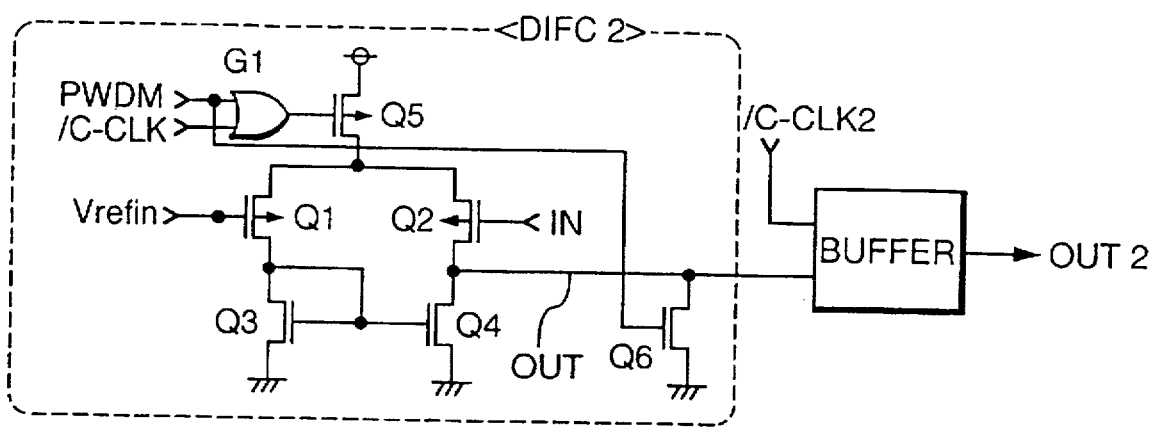
FIG. 3 is a circuit diagram showing an embodiment of the input circuit DIFC2 in FIG. 1.

FIG. 3 shows a circuit diagram of an embodiment of the second input circuit DIFC2. The second input circuit DIFC2 is intermittently operated in accordance with a (internal) clock signal /C-CLK in order to decrease the power consumption of the DIFC2 by noticing that the (external) input signal IN, which corresponds to the control signal from external terminal COM, is input synchronously with the (external) clock signal CLK. That is, in a differential amplifier having the same structure as the circuit in FIG. 2 and comprising MOSFETs Q1 to Q6, the (internal) clock signal /C-CLK is supplied to the gate of the current-source MOSFET Q5 through an OR gate circuit G1. In the case of this embodiment, the OR gate circuit G1 is used and the control signal PWDM is supplied together with the (internal) clock signal /C-CLK in order to turn off the current-source MOSFET Q5(current source circuit) without condition in the above low power consumption mode.

As described above, correspondingly to the fact that the differential amplifier comprising the MOSFETs Q1 to Q5 is intermittently operated in accordance with the (internal) clock signal /C-CLK, sampling and holding functions are given to the buffer circuit Buffer which receives an amplified output of the differential amplifier. That is, the buffer circuit Buffer samples the amplified output signal when the (internal) clock signal /C-CLK2 is supplied and the differential amplifier is operated and holds the captured amplified output signal when the differential amplifier is not operated. Therefore, the buffer circuit Buffer can use a through-latch circuit. Instead of the through-latch circuit, however, it is possible for the buffer circuit Buffer to use a transmission gate MOSFET to be turned on by the (internal) clock signal /C-CLK2 and a sample-and-hold circuit according to a CMOS inverter circuit to whose gate a signal input through the transmission gate MOSFET is supplied and which uses the gate input capacitance as a capacitor. The amplitude of an output signal (internal signal) OUT2 is larger than that of the (external) input signal IN.

Figure 4:
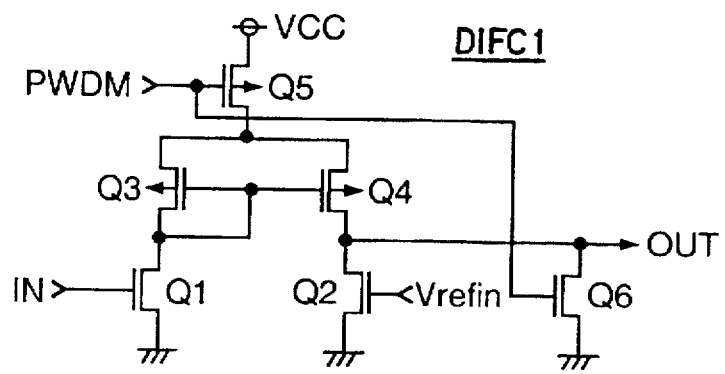
FIG. 4 is a circuit diagram showing another embodiment of the input circuit DIFC1 in FIG. 1.

FIG. 4 shows a circuit diagram of another embodiment of the first input circuit DIFC1. In the case of this embodiment, the input signal IN, which corresponds to the clock signal for external terminal CLK, and the reference voltage Vrefin are supplied to the gate and the source of each of a pair of N-channel MOSFETs Q1 and Q2. That is, the input MOSFETs Q1 and Q2 respectively comprise an N-channel MOSFET and the ground potential of the circuit is supplied to the sources of them. Thereby, the MOSFETs Q1 and Q2 are made to generate a current signal corresponding to an input voltage supplied between the source and gate of each of them.

Though not restricted, when an input signal is a signal corresponding to the GTL circuit, the threshold voltage of the input MOSFETs Q1 and Q2 is set to a low value such as 0.4 V and the reference voltage Vrefin of them is set to a value such as 0.8 V. In the case of this embodiment, level sensing by the reference voltage Vrefin is not performed like the differential amplifier but current sensing corresponding to the input signal IN and the reference voltage Vrefin is performed. That is, the MOSFET Q2 generates the drain current of the MOSFET Q1 when the input signal IN is high-level and a current half the drain current of the MOSFET Q1 when the input signal IN is low-level. Therefore, the reference voltage Vrefin is different from that of the embodiment in FIG. 2 and it is not always necessary that the level is kept at an intermediate level between the high level and low level of the input signal IN.

For example, it is also possible to set the channel width of the MOSFET Q2 to a value ½ the channel width of the MOSFET Q1 and apply the terminating voltage Vt of a bus circuit such as 1.2 V to the gate of the MOSFET Q2. Moreover, in a current mirror circuit comprising the P-channel MOSFETs Q3 and Q4 set between the MOSFETs Q1 and Q2 obtained by equalizing the size of the MOSFET Q1 with that of the MOSFET Q2 and applying the terminating voltage Vt to the gate of the MOSFET Q2, it is possible to supply a current approx. two times larger than the drain current of the MOSFET Q2 when the input signal IN is high-level by setting the size of the MOSFET Q3 to a value two times larger than that of the MOSFET Q4.

That is, in the circuit of this embodiment, when the input signal IN is low-level, a drain current of the MOSFET Q1 corresponding to the low level is supplied to the drain of the MOSFET Q2 through the MOSFETs Q3 and Q4(load circuit). In this case, because the drain current of the MOSFET Q2 is larger as described above, it is possible to generate a low-level output signal such as the circuit ground potential by discharging an output OUT to the low level. However, when the input signal IN is high-level, a drain current of the MOSFET Q1 corresponding to the low level is supplied to the drain of the MOSFET Q2 through the MOSFETs Q3 and Q4. In this case, because the drain current of the MOSFET Q1 is larger than that of the MOSFET Q2, the high level such as the power supply voltage VCC is generated by charging the output OUT up to the high level.

In the case of this embodiment, the sources of the MOSFETs Q3 and Q4 constituting the current mirror circuit are provided with a power switch MOSFET Q5 for voltage supply respectively. The control signal PWDM for reducing the current consumption in the above low power consumption mode is supplied to the gate of the MOSFET Q5(current source circuit). In the case of a semiconductor integrated circuit device not having the low power consumption mode, the power supply voltage VCC is applied to the sources of the MOSFETs Q3 and Q4.

The above input circuit of the current sensing system can also be used for the second input circuit DIFC2 in FIG. 1. That is, it is possible to supply the clock signal /C-CLK to the gate of the MOSFET Q5 in FIG. 4 or supply the control signal PWDM and the clock signal /C-CLK to the gate circuit G1 of the embodiment having the low power consumption mode in FIG. 3. Moreover, it is possible to set a buffer circuit Buffer same as that described in FIG. 3 to the output section of the gate circuit G1.

The input circuit of this embodiment can use even an N-channel MOSFET in which an input signal is deflected to the circuit ground potential side like a GTL circuit as an input MOSFET. That is, when using an N-channel differential MOSFET for an interface of the above GTL, the operating voltage of a current source MOSFET set between the common source and the circuit ground potential becomes insufficient and thereby, adequate operations cannot be expected. Therefore, a P-channel MOSFET is used like the embodiment in FIGS. 2 or 3. In this case, however, the size of the MOSFET when provided with the same conductance increases and as a result, a problem occurs that the gate input capacitance increases.

As described later, it is possible to use the conducting type of each MOSFET of the embodiment in FIG. 4 by reversing it at a pseudo ECL level or ALTS level deflected to the power supply voltage side. That is, in the case of a MOSFET receiving an input signal and a reference voltage, it is possible to use a MOSFET constituting a current mirror circuit as a P-channel MOSFET and a MOSFET serving as a power switch as an N-channel MOSFET.

FIGS. 5(A) and 5(B) show timing charts for explaining operations of an input circuit of the present invention. FIG. 5(A) shows a circuit for directly amplifying the input signal IN inputted synchronously with a clock signal and capturing it and FIG. 5(B) shows a timing chart for explaining operations of a second input circuit of the present invention. In the case of the circuit in FIG. 5(A), a case is shown in which the input signal IN inputted synchronously with the clock signal CLK so as to have a setup time tCS and a hold time tCH is directly amplified and captured by the circuit. The time delay between the input signal IN and a signal OUT captured by the circuit corresponds to the delay time in an amplifier. In the case of the input circuit, the power consumption inevitably increases because a differential circuit is continuously operated.

However, the second input circuit of the present invention in FIG. 5(B) does not consume any operating current because the circuit is not operated while the internal clock signal /C-CLK generated by amplifying the clock signal CLK is high-level. In this case, because of the high level of the internal clock signal /C-CLK, the MOSFET Q6 is turned on to fix the output OUT2 at the low level in the circuit of the embodiment in FIG. 3. In this case, a signal captured by the buffer circuit Buffer before the MOSFET Q6 is turned on is held and an output signal OUT2 is output.

When the internal clock signal /C-CLK becomes low-level correspondingly to a change of the clock signal CLK, the current source MOSFET Q5 is turned on and the differential amplifier is activated to detect that the input signal IN is high-level or low-level by referring to the reference voltage Vrefin and generate the high-level or low-level output signal OUT. The output signal OUT is captured as the output signal OUT2 through the buffer circuit Buffer.

The amplified signal OUT is practically nullified after generating the internal clock signal /C-CLK2 to be supplied to the output buffer by delaying it by the amplifying period and making the buffer circuit Buffer latch it by the edge of the signal. Therefore, in the case of the embodiment in FIG. 3, it is also possible that the MOSFET Q5 is turned off at the timing when the clock /C-CLK2 is made low-level to minimize the period in which a differential circuit is activated. Thus, even if the pulse duty of the clock signal /C-CLK is 50%, it is possible to decrease the current consumption of the differential circuit to ½ or less correspondingly to the amplifying period.

Moreover, it is possible to use a delay time in an input circuit, that is, a signal delay time of the internal clock /C-CLK to the external clock CLK as the setup time tCS by changing an externally supplied input signal synchronously with the external clock signal CLK. When using the signal delay time as the setup time tCS, it is unnecessary to additionally set the setup time tCS or hold time tCH by having a certain temporal margin including the signal delay time in the input circuit and therefore, it is possible to shorten the cycle of the clock signal CLK (that is, to increase the frequency of the signal) by a value equivalent to an additional setting time of the setup time or hold time.

Figure 6A:
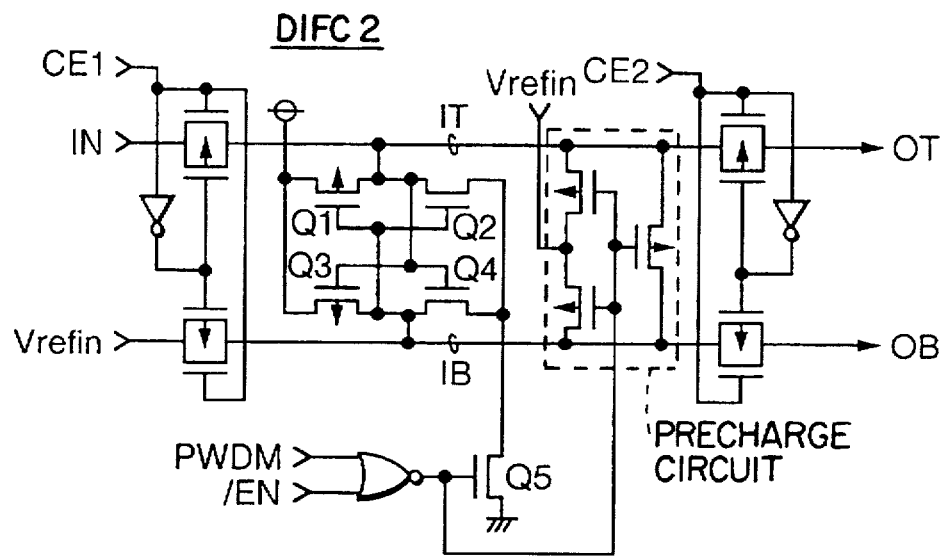
FIGS. 6(A) and 6(B) are circuit diagrams showing still another embodiment of the input circuit DIFC2 in FIG. 1.
Figure 6B:
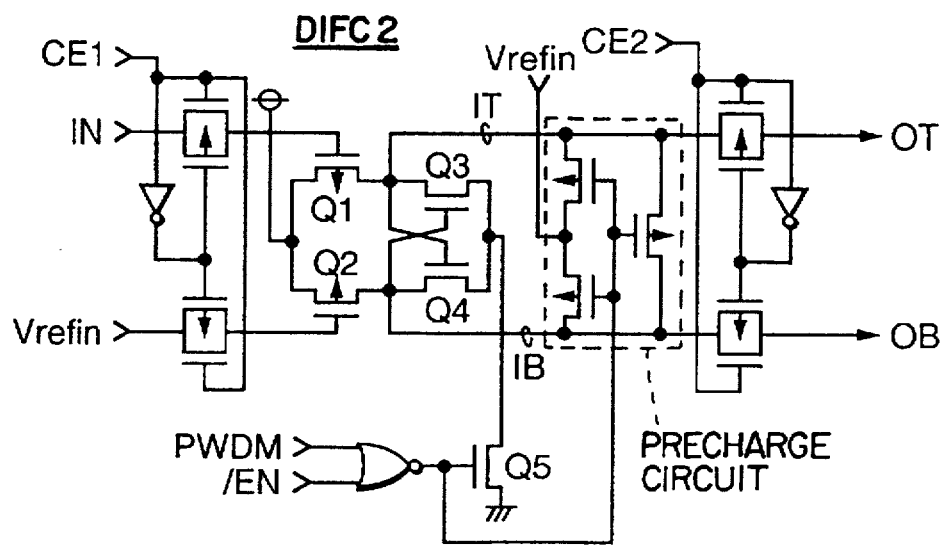

FIGS. 6(A) and 6(B) show circuit diagrams of another embodiment of the second input circuit DIFC2. The circuit shown in FIG. 6(A) performs amplification and latching by using a latch circuit comprising a CMOS. The CMOS latch circuit is constituted by intersecting and connecting inputs and outputs of two CMOS inverter circuits comprising the P-channel MOSFETs Q1 and Q3 and the N-channel MOSFETs Q2 and Q4 to each other. The N-channel MOSFET Q5 for supplying a circuit potential to the CMOS latch circuit as an operating voltage is used in order to start the amplification by the latch circuit synchronously with a clock signal. Moreover, a pair of input/output nodes IT and IB of the latch circuit are provided with a precharge circuit comprising a MOSFET for shorting the nodes IT and IB and a MOSFET for supplying the reference voltage Vrefin.

A pair of input/output nodes (a pair of signal lines) IT and IB of the CMOS latch circuit are provided with a CMOS transmission gate circuit for capturing the input signal IN and the reference voltage Vrefin in accordance with a predetermined timing signal CE1 synchronizing with the clock signal CLK. Moreover, amplified latch signals in the input/output nodes IT and IB of the CMOS latch circuit are transferred to output terminals OT and OB through a CMOS gate circuit to be switch-controlled.

The control signal PWDM corresponding to the low power consumption mode and a signal /EN synchronizing with the clock signal CLK are transferred to the gate of the MOSFET Q5 for controlling start of operations of the CMOS latch circuit through a NOR gate circuit. An output signal of the NOR gate circuit is also used as a precharge signal for controlling operations of the precharge circuit.

In the case of the circuit shown in FIG. 6(B), the input signal IN and the reference voltage Vrefin are supplied to the gates of the P-channel differential MOSFETs Q1 and Q2 respectively through a CMOS transmission gate circuit like the above mentioned. Then, drains of the differential MOSFETs Q1 and Q2 are provided with N-channel MOSFETs Q3 and Q4 in which a gate and a drain are intersected and connected to each other and brought into a latched mode as active load circuits. Therefore, in the circuit in FIG. 6(B), an amplifying section and a latching section are separately constituted. The output nodes (a pair of signal lines) IT and IB are provided with a precharge circuit like the above mentioned. Because the output nodes IT and IB are finally determined by drain outputs of the differential MOSFETs Q1 and Q2, it is possible to omit the precharge circuit. However, by using a precharge circuit like the precharge circuit of this embodiment, it is possible to make a storage state of the latching section quickly respond to a differential amplified output of an input signal.

Figure 7:
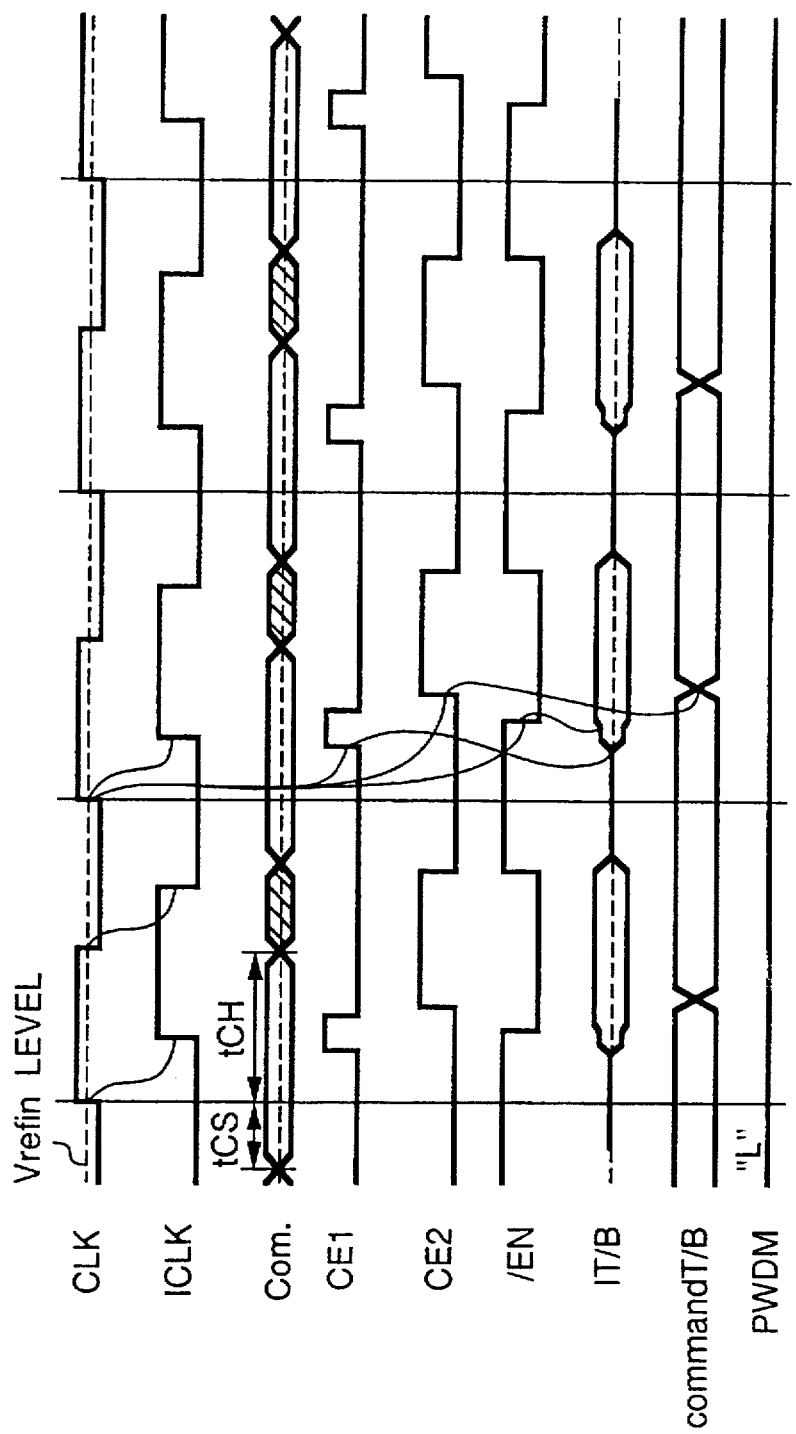
FIG. 7 is a timing chart for explaining operations of the input circuit DIFC2 shown in FIG. 6.

FIG. 7 shows a timing chart for explaining operations of the input circuit DIFC2 in FIGS. 6(A) and 6(B). The control signal /EN corresponds to an internal clock obtained by amplifying the clock signal CLK supplied from an external terminal. The timing signal CE1 is generated synchronously with the period of the first half portion of the timing signal /EN and a timing signal CE2 is generated synchronously with the period of the second half portion of the signal /EN. These timing signals CE1 and CE2 can take various embodying cases in which they are generated by the above /EN and they are directly generated from the clock signal CLK.

While the signal /EN is high-level, the period is regarded as a precharge period. In the case of the circuit in FIG. 6(A), the input/output modes (a pair of signal lines) IT and IB of the CMOS latch circuit are shorted and precharged to the reference voltage Vrefin. In the case of the circuit in FIG. 6(B), the output nodes (a pair of signal lines) IT and IB of the active load circuit are shorted and precharged to the reference voltage Vrefin.

While the timing signal CE1 is high-level, the CMOS transmission gate circuit at the input side is turned on and the (external) input signal IN input from the outside of a semiconductor integrated circuit device and the reference voltage Vrefin are captured. Then, in the case of the circuit in FIG. 6(A), when the signal /EN becomes low-level, the CMOS latch circuit is operated and the input/output nodes IT and IB are complementarily changed to high and low levels at a high speed by the amplification followed by positive feedback. In the case of the circuit in FIG. 6(B), when the signal /EN becomes low-level, the output nodes (a pair of signal lines) IT and IB of the differential amplified output and the output signal are similarly changed to high and low levels by the positive-feedback amplification in the load circuit. The amplitude of internal signals on a pair of signal lines IT and IB is smaller than that of the (external) input signal IN.

When the timing signal CE1 is made low-level, the CMOS transmission gate circuit at the input side is turned off and disconnected from the input side to latch the signal CE1. When the timing signal CE2 becomes high-level, the CMOS transmission gate circuit at the output side is turned on and the latched signal CE1 is transferred to the output terminals OT and OB. When the signal /EN is made high-level, precharging is started and an output node is set to the reference voltage Vrefin, but no current is consumed during this period.

When a CMOS latch circuit is used like the circuit in FIG. 6(A), current is consumed only while the input signal IN is captured and amplified. That is, no direct current continuously flows through a CMOS circuit because either N-channel or P-channel MOSFET is turned off when a signal level is set to the high or low level. Therefore, the reason for turning off the MOSFET Q5 in accordance with the high level of the signal /EN is different from the case of the embodiment in FIG. 2 or 3 in that it is not intended to decrease power consumption but perform a preliminary operation (precharging) for capturing the next input signal by resetting a signal held by a latch circuit.

Therefore, while the signal /EN is high-level, the timing signal CE2 is made low-level and moreover, the CMOS transmission gate circuit at the output side is turned off. Thus, the output signals OT and OB are held by a not-illustrated proper latch circuit described above.

Figure 8:
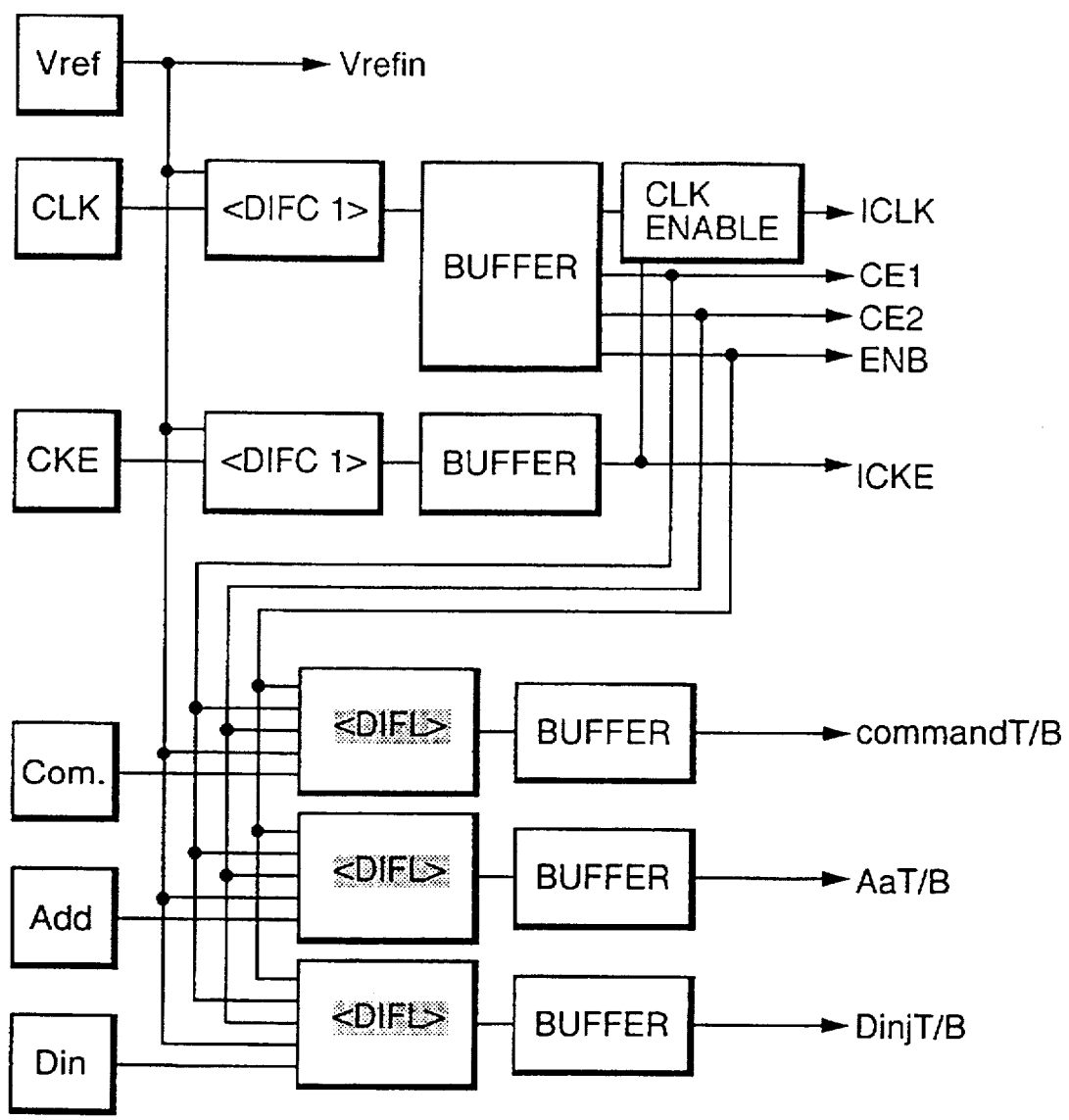
FIG. 8 is a schematic block diagram showing an embodiment of an input circuit when the present invention is applied to a synchronous dynamic RAM.

FIG. 8 shows a schematic block diagram of an embodiment of an input circuit when the present invention is applied to a synchronous dynamic RAM. In the case of this embodiment, the clock signal CLK and a clock enable signal CKE use the input circuit DIFC1 to be continuously operated like the circuits of the embodiments in FIGS. 2 and 4. However, a command signal Com., address signal Add, and input data Din use the latch-type input circuit shown in FIG. 6(A) or 6(B).

Therefore, the buffer circuit Buffer set to the output section of the input circuit DIFC1 for receiving the clock signal CLK is provided with a function for generating the timing signals CE1 and CE2 and the control signal ENB necessary for operations of the above input circuit. In this case, ENB has the same meaning as /EN, in which the low level serves as an active level. Moreover, an internal clock enable signal is supplied to a clock circuit (CLK enable) through the input circuit DIFC1 for receiving the clock enable signal and the buffer circuit Buffer. Thereby, the internal clock signal ICLK is generated when the clock enable signal CKE is set to the active level.

Figure 9:
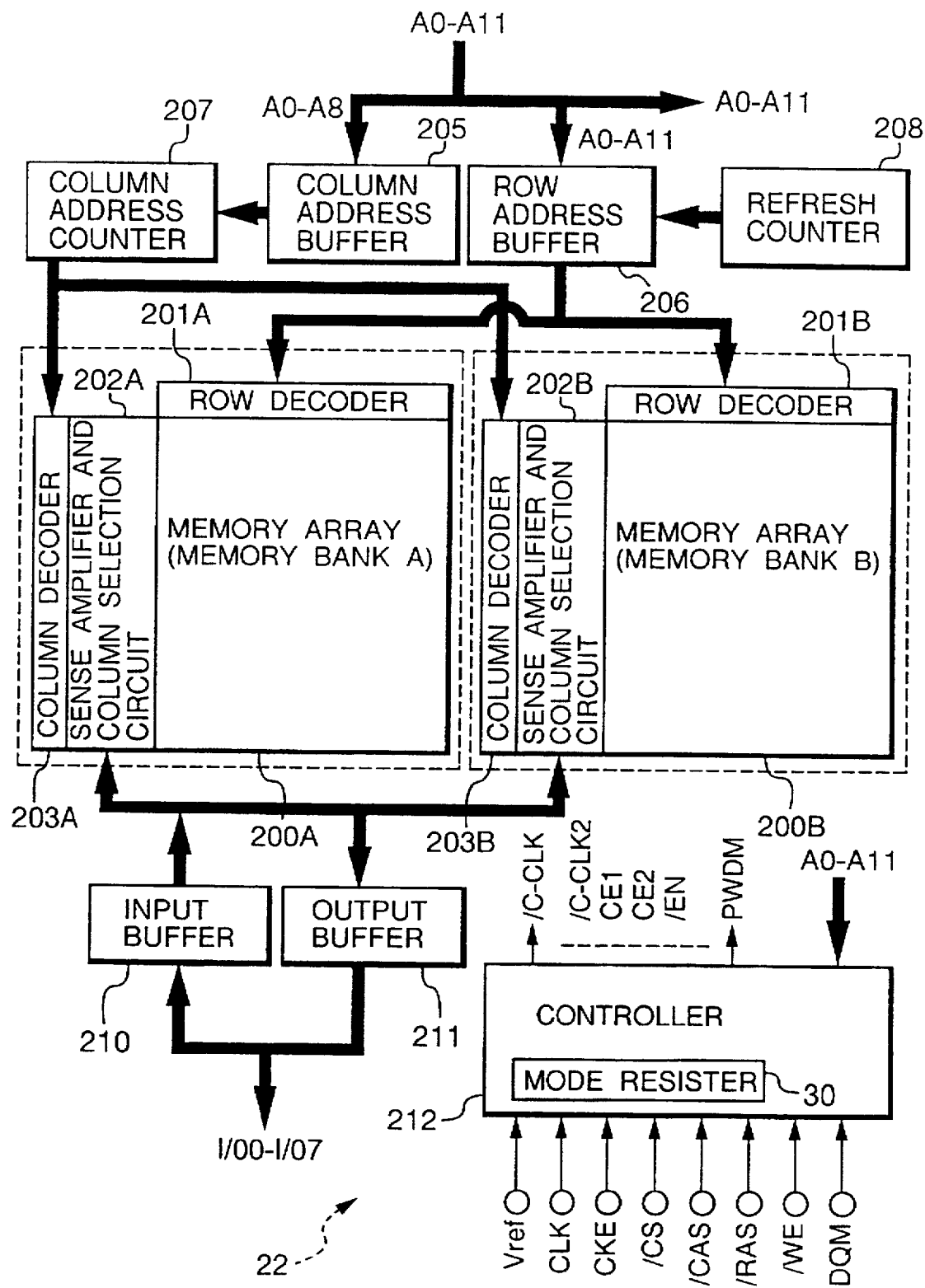
FIG. 9 is a block diagram showing an embodiment of a synchronous DRAM to which the present invention is applied.

FIG. 9 shows a block diagram of an embodiment of a synchronous DRAM (hereafter referred to as an SDRAM) to which the present invention is applied. The SDRAM in FIG. 9, though not restricted, is formed on a semiconductor substrate made of, for example, single-crystal silicon by a semiconductor integrated circuit fabrication art known to the public.

The SDRAM of this embodiment is provided with a memory array 200A constituting a memory bank A (BANKA) and a memory array 200B constituting a memory bank B (BANKB). Each of the memory arrays 200A and 200B is provided with dynamic memory cells arranged like a matrix. According to FIG. 9, a selection terminal for memory cells arranged in the same column is connected to a word line (not illustrated) for each column and a data input/output terminal of memory cells arranged in the same row are connected to a complementary data line (not illustrated) for each row.

One of the word lines (not illustrated) of the memory array 200A is driven to a selected level in accordance with the decoding result of a row address signal by a row decoder 201A. Complementary data lines (not illustrated) of the memory array 200A are connected to a sense amplifier and a column selection circuit 202A. The sense amplifier and that in the column selection circuit 202A are amplifiers for detecting and amplifying a minute potential difference appearing on each complementary data line when data is read out of a memory cell. A column switching circuit of the amplifier is a switching circuit for selecting each complementary data line to conduct it to a complementary common data line. A column switching circuit is selectively operated in accordance with a decoding result of a column address signal by a column decoder 203A.

The memory array 200B side is also provided with a row decoder 201B, a sense amplifier, a column selection circuit 202B, and a column decoder 203B. The complementary common data line is connected to an output terminal of an input buffer 210 and an input terminal of an output buffer 211. An input terminal of the input buffer 210 and an output terminal of the output buffer 211 are connected to 8-bit data input/output terminals I/00 to I/07.

Row address signals and column address signals supplied from address input terminals A0 to A11 are captured by a column address buffer 205 and a row address buffer 206 in the address multiplex form. The supplied address signals are held by each buffer. The row address buffer 206 captures a refresh address signal output from a refresh counter 208 as a row address signal in the refresh operation mode. An output of the column address buffer 205 is supplied as preset data of a column address counter 207 and the column address counter 207 outputs the column address signal serving as the preset data or a value obtained by sequentially incrementing the column address signal to the column decoders 203A and 203B.

A controller 212, though not restricted, receives external control signals such as a clock signal CLK, clock enable signal CKE, chip select signal /CS, column address strobe signal /CAS (symbol "/" represents that a signal provided with the symbol "/" is a row enable signal), row address strobe signal /RAS, write enable signal /WE, and data input/output mask control signal DQM, control data output from the address input terminals A0 to A11, and the reference voltage Vref and generates an internal timing signal for controlling operation modes of an SDRAM and operations of the above circuit block in accordance with a change of levels of these signals and timing of them. Therefore, the controller 12 is provided with a control logic (not illustrated) and a mode register 30 for generating the internal timing signal.

The clock signal CLK is used as a master clock of an SDRAM and other external input signals are made significant synchronously with the leading edge of the internal clock signal concerned. The chip select signal /CS designates start of a common input cycle when it is low-level. A high-level chip select signal /CS (no-chip selection state) and other inputs do not have any significance. However, a selective state of a memory bank to be mentioned later and an internal operation such as a burst operation are not subject to the change to the no-selection state. The signals /RAS, /CAS, and /WE are different from a corresponding signal in the normal DRAM in functions and serve as significant signals when defining a command cycle to be mentioned later.

The clock enable signal CKE is a signal for designating the validity of the next clock signal. The leading edge of the next clock signal CLK is regarded to be valid when the signal CKE is high-level but it is regarded to be invalid when the signal CKE is low-level. Moreover, though not illustrated, an external control signal for controlling the output enable for the output buffer 211 in the read mode is also supplied to the controller 212. When the external control signal is, for example, high-level, the output buffer 211 is brought under a high output impedance state.

The above row address signal is defined by the level of A0 to A11 in a row-address-strobe bank-active command cycle to be mentioned later synchronizing with the leading edge of the clock signal CLK (internal clock signal). An input from A11 is regarded as a bank selection signal in the row-address-strobe bank-active command cycle. That is, a memory bank BANKA is selected when the input of A11 is low-level and a memory bank BANKB is selected when the input is high-level. Memory bank selection control, though not restricted, can be performed by such processing as activation of only the row decoder at the selected memory bank side, no-selection of any column switching circuit at the unselected memory bank side, or connection to the input buffer 210 and output buffer 211 at only the selected memory bank side.

An input of A10 in a precharge command cycle to be mentioned later designates a precharging mode of a complementary data line or the like. The high level of the input designates that precharging objects are both memory banks and the low level of it designates that a precharging object is either memory bank designated by A11.

The column address signal is defined by the level of A0 to A8 in a read or write command (column address read command or column address write command to be mentioned later) cycle synchronizing with the leading edge of the clock signal CLK (internal clock). Then, a column address thus defined serves as a start address for burst access.

Then, main operation modes of an SDRAM to be designated by commands are described below.

(1) Mode register setting command (Mo)

This is a command for setting the mode register 30 which is designated by the command when /CS, /RAS, /CAS, and /WE are low-level, and data to be set (register set data) is supplied through A0 to A11. The register set data, though not restricted, represents burst length, CAS latency, or write mode. Though not restricted, the burst length to be set includes 1, 2, 4, 8, and full page (256), the CAS latency to be set includes 1, 2, and 3, and the write mode to be set includes burst write and single write.

The CAS latency designates the number of cycles of an internal clock signal to be consumed during the period from the trailing edge of /CAS to an output operation of the output buffer 211 in a read operation designated by a column address read command to be mentioned later. An internal operation time for reading data is necessary until data to be read is determined. Therefore, the CAS latency is used to set the time in accordance with a frequency used for an internal clock signal. In other words, the CAS latency is set to a relatively large value when using an internal clock signal with a high frequency and a relatively small value when using an internal clock signal with a low frequency.

(2) Row-address-strobe bank-active command (Ac)

This is a command for enabling designation of a row address strobe and selection of a memory bank by A11, which is designated when /CS and /RAS are low-level and /CA and /WE are high-level. In this case, an address to be supplied to A0 to A11 is captured as a row address signal and a signal to be supplied to A11 is captured as a memory-bank selection signal. Capturing is performed synchronously with the leading edge of an internal clock signal as described above. For example, when this command is designated, word lines in a memory bank designated by the command are selected and a memory cell connected with each word line is connected with a corresponding complementary data line.

(3) Column address read command (Re)

This is a command necessary to start a burst read operation and a command for giving a designation of a column address strobe, which is designated when /CS and /CAS are low-level and /RAS and /WE are high-level. In this case, a column address supplied to A0 to A8 is captured as a column address signal. The column address signal thus captured is supplied to the column address counter 207 as a burst start address. Because a memory bank and word lines in the memory bank are selected in the row-address-strobe bank-active command cycle before the burst read operation designated by the counter 207 is started, memory cells of the selected word lines are sequentially selected in accordance with an address signal output from the column address counter 207 and continuously read. Then number of data values to be continuously read is equal to the number of data values designated by the burst length. Data read from the output buffer 211 is started after the number of cycles of an internal clock signal specified by the CAS latency is shown.

(4) Column address write command (Wr)

This command serves as a command necessary to start a burst write operation when burst write is set to the mode register 30 as a write operation mode and a command necessary to start a single write operation when single write is set to the mode register 30 as a write operation mode. Moreover, the command gives the designation of a column address strobe in the case of single write and burst write. The command is designated when /CS, /CAS, and /WE are low-level and /RA is high-level. In this case, an address supplied to A0 to A8 is captured as a column address signal. The column address signal thus captured is supplied to the column address counter 207 as a burst start address in the case of burst write. The burst write procedure thus designated is also performed similarly to the burst read operation. However, the CAS latency is not used for a write operation and write data is captured with the column address write command cycle.

(5) Precharge command (Pr)

This is used as a command for starting precharging for a memory bank selected by A10 and A11 and designated when /CS, /RAS, and /WE are low-level and /CAS is high-level.

(6) Auto refresh command

This is a command required to start auto refresh, which is designated when /CS, /RAS, and /CAS are low-level and /WE and CEK are high-level.

(7) Burst-stop-in-full-page command

This is a command necessary to stop a burst operation for full page on all memory banks, which is ignored for burst operations other than the burst operation for full page. This command is designated when /CS and /WE are low-level and /RAS and /CAS are high-level.

(8) No-operation command (Nop)

This is a command for designating that no practical operation is performed, which is designated /CS is low-level and /RAS, /CAS, and /WE are high-level.

In the case of an SDRAM, when a row-address-strobe bank-active command is supplied by designating the other memory bank while a burst operation is performed in one memory bank, a row address system in the other memory bank can be operated without influencing operations of one memory bank under execution. For example, the SDRAM has means for holding data, addresses, and control signals supplied from the outside and the holding contents, though not restricted, are held by each memory bank. Or, data for one data line in a memory block selected in the row-address-strobe bank-active command cycle is previously latched by a latch circuit not illustrated for a read operation before a column system operates.

Therefore, unless data values collide with each other in the data input/output terminals I/00 to I/07, it is possible to issue a precharge command and a row-address-strobe bank-active command to a memory bank different from a memory bank to be processed by a command currently executed to previously start internal operations.

An SDRAM 22 can input or output data, an address, or a control signal synchronously with a clock signal (internal clock signal). Therefore, it is understood that it is possible to operate a large-capacity memory equivalent to a DRAM at a high speed equal to the operation speed of an SRAM and continuously read or write a plurality of data values by designating the number of data values to be accessed to one word line by a burst length and thereby sequentially switching column-system selection states by the column address counter 207.

Figure 10:
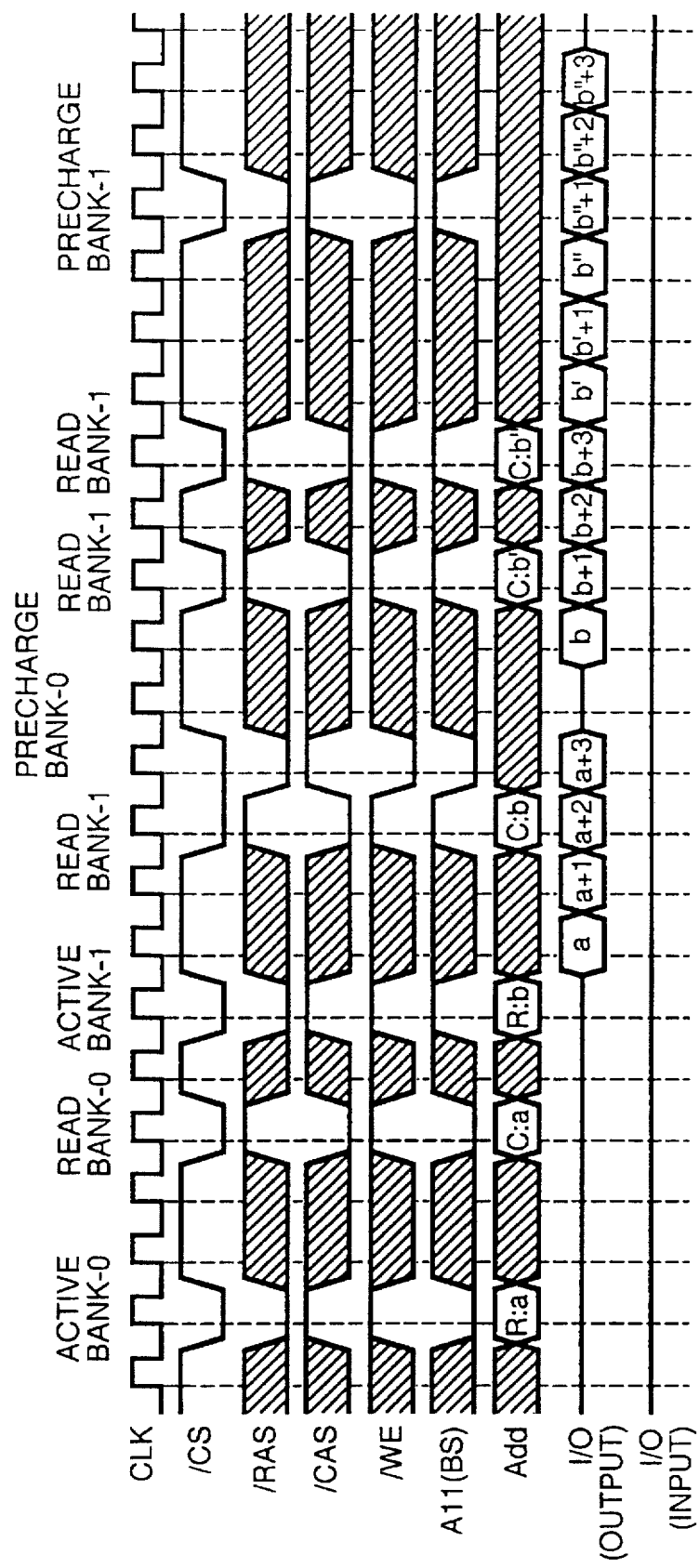
FIG. 10 is a timing chart for explaining a read cycle of an SDRAM to which the present invention is applied.

FIG. 10 shows a timing chart for explaining a read cycle of an SDRAM to which the present invention is applied. A row address R:a is captured when /CS and /RAS are low-level. Moreover, a bank-0 is made active when the address A11 (bank select BS) is low-level and a row-system address selecting operation is started for the bank-0. After three clocks, /CAS is made low-level, a column address C:a is captured, and a column-system selecting operation is started.

When the CAS latency is set to 3, an output signal a is output three clocks later. When burst read is designated, data values a+1, a+2, and a+3 are sequentially output synchronously with a clock. Simultaneously with the above read operation, an active bank-1 is designated, and a row address R:b corresponding to the active bank-1 and then, a column address C:b is input three clocks later. Thereby, data values b, b+1, b+2, and b+3 are sequentially read three clocks later.

Moreover, by designating a read bank-1 and inputting a column address C:b', data values b' and b'+1 are output three clocks after the column address C:b' is input. By designating the read bank-1 and inputting a column address C:b" two clocks later, b' is replaced with b" and therefore, b", b"+1, b"+2, and b"+3 are output three clocks after b' is replaced with b".

Figure 11:
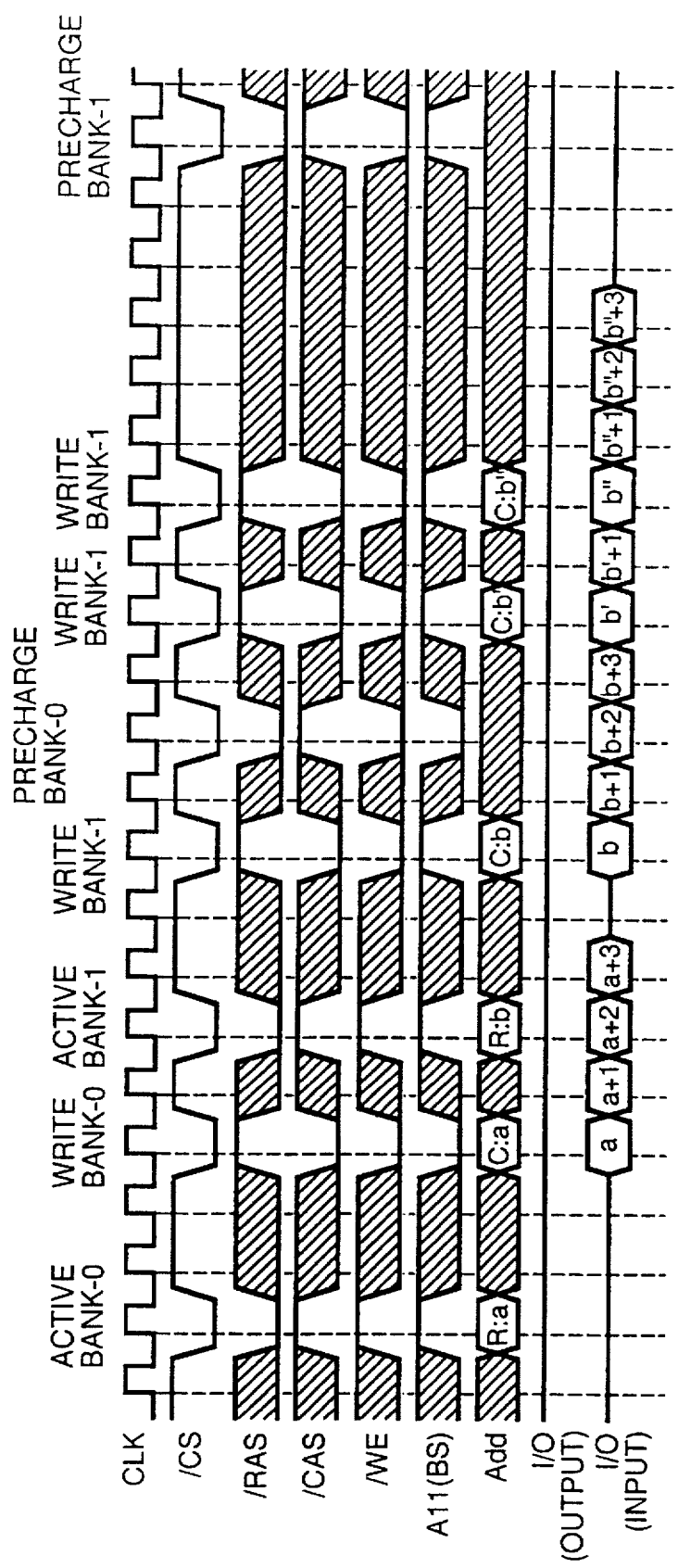
FIG. 11 is a timing chart for explaining a write cycle of an SDRAM to which the present invention is applied.

FIG. 11 shows a timing chart for explaining a write cycle of an SDRAM to which the present invention is applied. When /CS and /RAS are low-level, a row address R:a is captured. Moreover, when the address A11 (bank select BS) becomes low-level, a bank-0 is made active and a row address selecting operation is started for the bank-0. When three clocks pass, /CAS is made low-level, a column address C:a is captured, and a column selecting operation is started. At the same time, input write signal a is written in a selected memory cell. Thereafter, a column address is updated correspondingly to burst write and data values a+1, a+2, and a+3 are written synchronously with a clock.

Simultaneously with the above burst write operation, the active bank-1 is designated, and a row address R:b corresponding to the active bank-1 is input and a column address C:b is input three clocks after the row address R:b is input and write data b is written. Thereafter, data values b+1, b+2, and b+3 are sequentially written synchronously with a clock. Hereafter, by designating a write bank-1 to input a column address C:b', inputting write data values b' and b'+1, and designating the read bank-1 to input the column address C:b", the column address b' is replaced with the column address b" and therefore, data values b", b"+1, b"+2, and b"+3 corresponding to b" are sequentially written.

Figure 12:
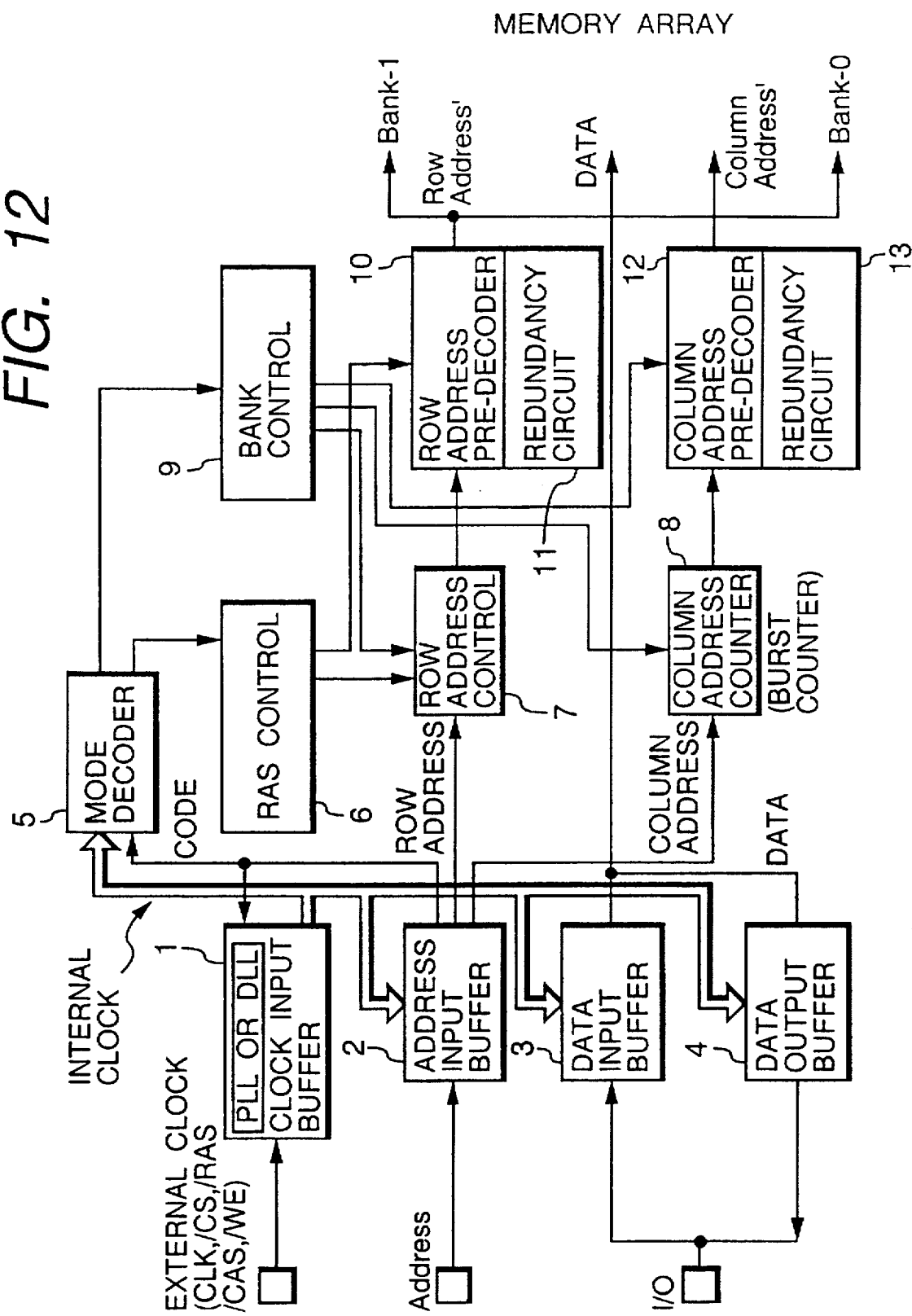
FIG. 12 is a block diagram of an input section showing another embodiment of an SRAM to which the present invention is applied.

FIG. 12 shows a block diagram of the input section of another embodiment of an SDRAM to which the present invention is applied. In FIG. 12, input and output buffers and internal circuits related to the buffers are typically shown.

A clock input buffer 1 receives not only an external clock CLK but also such control signals as a chip select signal /CS, row address strobe signal /RAS, column address strobe signal /CAS, and write enable signal /WE to generate various control signals necessary for internal operations. Moreover, differently from a normal synchronous DRAM, the external clock CLK is not directly used as an internal clock but an internal clock is generated by a PLL circuit (or DLL circuit) included in the clock input buffer 1.

That is, the external clock CLK is input to a phase comparator of the PLL circuit (or DLL circuit) in which the external clock CLK is compared with an internal clock, the phase control (frequency control) of the internal clock is performed correspondingly to the external clock CLK, and an internal clock synchronizing with the external clock is generated. This structure makes it possible to practically eliminate signal delays in an input buffer, eliminate the necessity for considering the delay time of the clock signal CLK during the setup time of the clock signal CLK and various input signals inputted synchronously with the clock signal CLK, and greatly increase the frequency of the external clock CLK, compared with the above circuit directly using the external clock CLK as an internal clock.

An address input buffer 2 captures the above address signal to be input in time series. Not only a row address signal and a column address signal but also code information Code used for setting a mode are captured from the address input buffer 2. The code information Code is set to a mode register included in a mode decoder 5 and decoded by the mode decoder 5 and thereby, various control signals for realizing the operation corresponding to the code information.

A data input buffer 3 captures a write signal supplied from an input/output terminal I/O and transfers the signal to a memory array (not illustrated) as write data Data. A data output buffer 4 outputs read data Data read out for the memory array through an external terminal I/O.

A RAS control circuit (RAS control) 6 controls a row address control 7 and a row address predecoder 10 to control row address selecting operation of the rows. The row address control 7 outputs a row address signal or a refresh address signal. The row address predecoder 10 decodes an address signal and transmits a predecoded address signal (Row Address') to banks 0 and 1 (Bank-0 and Bank-1).

A bank control circuit (Bank Control) 9 controls a column address counter 8 and a column address predecoder 12 to control the address selecting operation of the columns. A column address signal (Column Address) is input to the column address counter 8 as the initial value. The column address counter 8 is also referred to as a burst counter. The column address predecoder 12 decodes an address signal and transmits a predecoded address signal (Column Address') to a memory array.

The row address predecoder 10 is provided with a redundant circuit (Redundancy) 11 and defective word lines are replaced with redundant word lines. The column address predecoder 12 is provided with a redundant circuit (Redundancy) 13 and defective data lines are replaced with redundant data lines.

Figure 13:
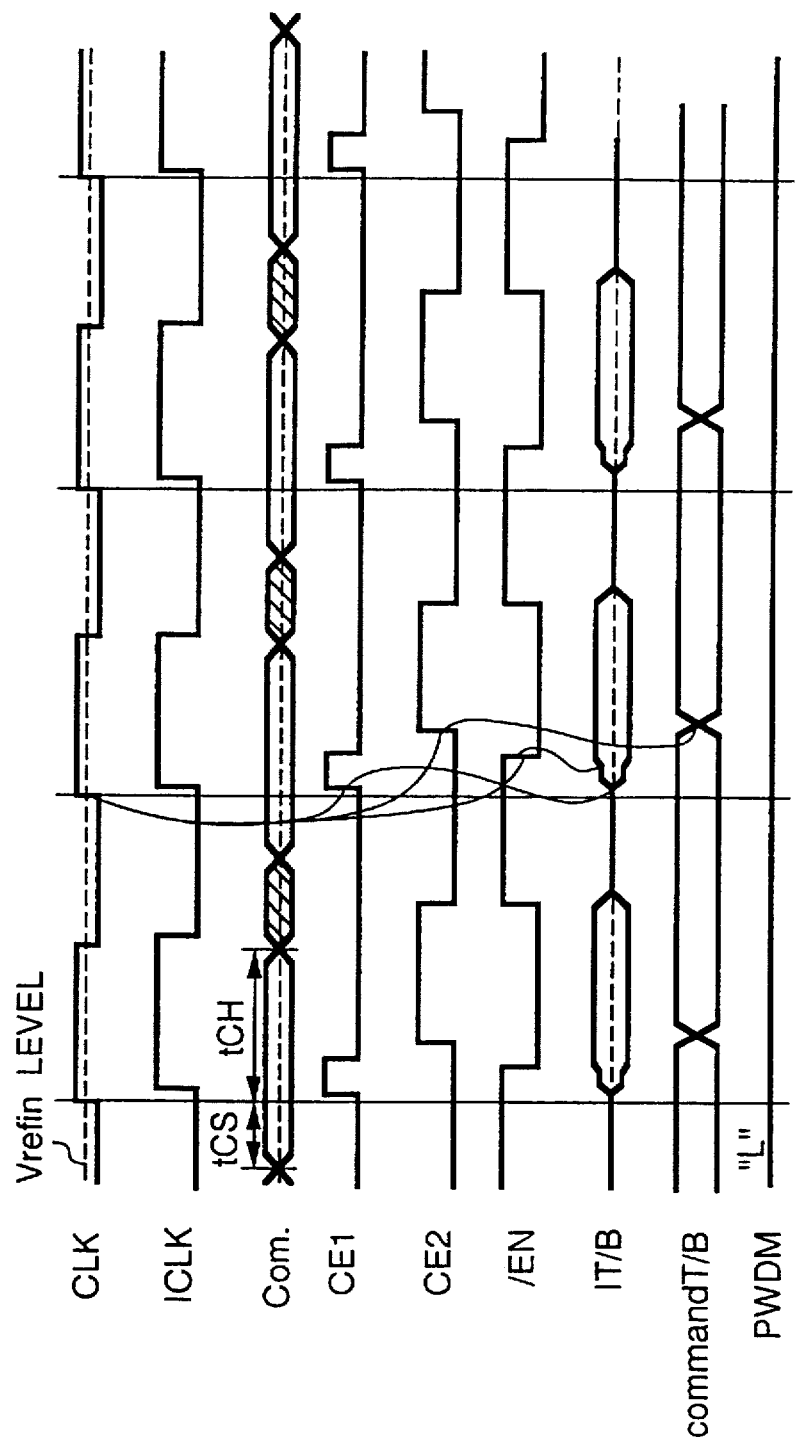
FIG. 13 is a timing chart for explaining operations of the input circuit shown in FIG. 12.

FIG. 13 shows a timing chart for explaining operations of the input circuit shown in FIG. 12. However, the input circuit specifically uses the circuit shown in FIG. 6. In FIG. 13, the control signal /EN and the clock signal CLK supplied from an external terminal are phase-locked with the internal clock ICLK by a PLL circuit or DLL circuit. Correspondingly to the above operation, the timing signal /EN is also almost phase-locked with the external clock CLK, the timing signal CE1 is generated synchronously with the first half period of the timing signal /EN, and the timing signal CE2 is generated synchronously with the second half period of the signal /EN. These timing signals CE1 and CE2 can be generated by the /EN or directly generated from the clock signal ICLK.

The period in which the signal /EN is high-level is regarded as a precharge period. In the case of the circuit in FIG. 6(A), the input/output nodes IT and IB of the CMOS latch circuit are shorted and precharged up to the reference voltage Vrefin. In the case of the circuit in FIG. 6(B), the output nodes IT and IB of the active load circuit are shorted and precharged up to the reference voltage Vrefin.

While the timing signal CE1 is high-level, the input-side CMOS transmission gate circuit is turned on and the input signal IN and the reference voltage Vrefin are captured. When the signal /EN becomes low-level, the CMOS latch circuit in the circuit in FIG. 6(A) is operated and the input/output nodes IT and IB are complementarily changed to high and low levels at a high speed by the amplification followed by positive feedback. In the case of the circuit in FIG. 6(B), the output nodes IT and IB are similarly complementarily changed to high and low levels by a differential amplified output and the positive-feedback amplification of the output signal in the load circuit.

When the timing signal CE1 is made low-level, the CMOS transmission gate circuit at the input side is turned off and disconnected from the input side to latch the signal CE1. When the timing signal CE2 becomes high-level, the output-side CMOS transmission gate circuit is turned on and the latched signal CE1 is transferred to the output terminals OT and OB. When the signal /EN is made high-level, precharging is started, the output nodes are set to the reference voltage Vrefin, and no current is consumed while the output nodes are set to the reference voltage similarly to the above mentioned.

While the signal /EN is high-level, the timing signal CE2 is made low-level and the output-side CMOS transmission gate circuit is also turned off. Therefore, the output signals OT and OB are held by a proper latch circuit (not illustrated) like the above mentioned. In the case of this embodiment, the time difference between the external clock CLK and the internal clock ICLK or timing signal /EN is practically eliminated. Therefore, it is unnecessary to consider the setup time tCS of the signal Com. or the like to be supplied from the outside and the delay time of the internal timing signal /EN or the like, increase the margin of the hold time tCH, or increase the frequency of the clock signal CLK up to a value equivalent to the increment of the margin.

Figure 14:
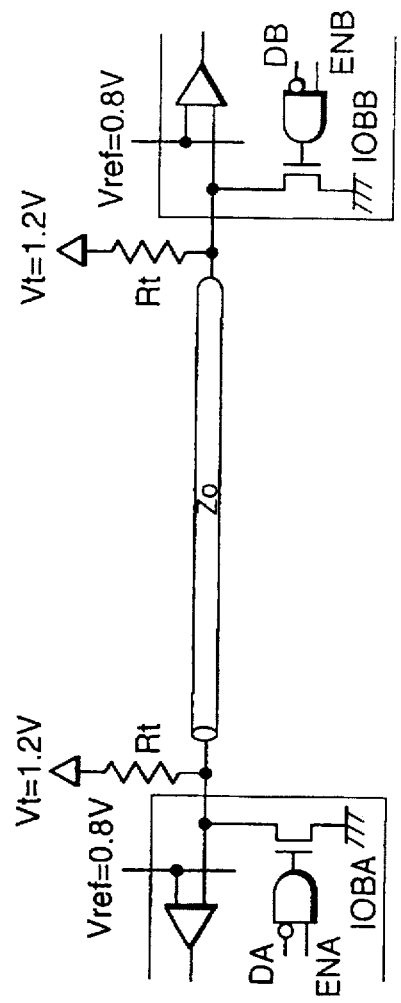
FIG. 14 is a schematic block diagram for explaining a GTL circuit to which the present invention is applied.

FIG. 14 shows a schematic block diagram for explaining a GTL circuit to which the present invention is applied. The GTL decreases the power consumption by decreasing a signal amplitude on a bus line to ½ or less compared to the conventional TTL (transistor-transistor logic) level. That is, the terminating voltage Vt of a bus circuit is set to a small value such as +1.2 V and a receiving circuit is made to use a differential amplifier having a reference voltage Vref such as 0.8 V. Thereby, the high level and the low level transferred to a signal transmission line are set to 1.2 V corresponding to the terminating voltage Vt and 0.4 V equivalent to a voltage drop due to the on-resistance of an output MOSFET respectively. When the present invention is applied to the above GTL interface, an input signal is supplied to an input circuit such as the above SDRAM through the signal transmission line. Then, the reference voltage Vref (Vrefin) is set to a voltage such as 0.8 V. It is also possible to generate the reference voltage Vref (Vrefin) in a semiconductor integrated circuit device.

Figure 15:
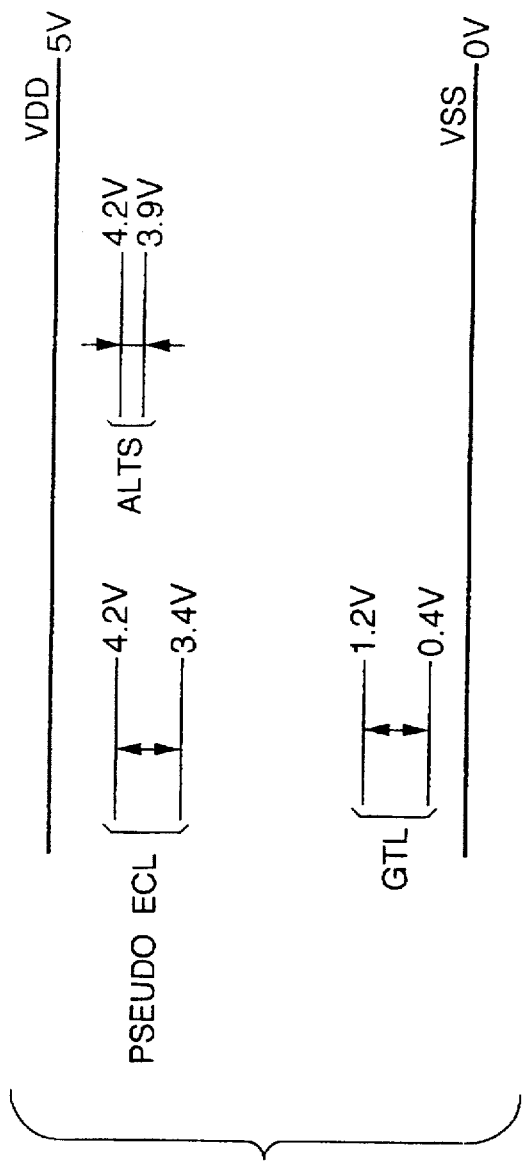
FIG. 15 is a level setting diagram for explaining a typical low-amplitude interface to which the present invention is applied.

FIG. 15 is a level setting diagram for explaining a typical low-amplitude interface to which the present invention is applied. One of the signals in FIG. 15 is a false ECL signal having a high level of 4.2 V and a low level of 3.4 V on the basis of the power supply voltage VDD such as +5 V instead of the ground potential 0 V of a conventional circuit, another is a GTL signal having a high level of 1.2 V and a low level of 0.4 V, and the last one is an ALTS signal having a high level of 4.2 V and a low level of 3.9 V previously proposed by the applicant of the present application. Moreover, a signal like LVTTL can be applied.

Figure 16A:
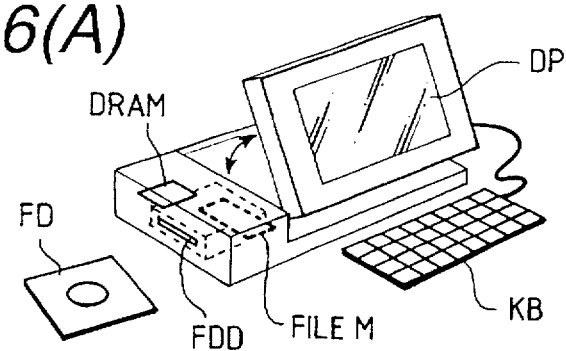
FIGS. 16(A) and 16(B) are block diagrams showing an embodiment of a personal computer using an SDRAM to which the present invention is applied.
Figure 16B:
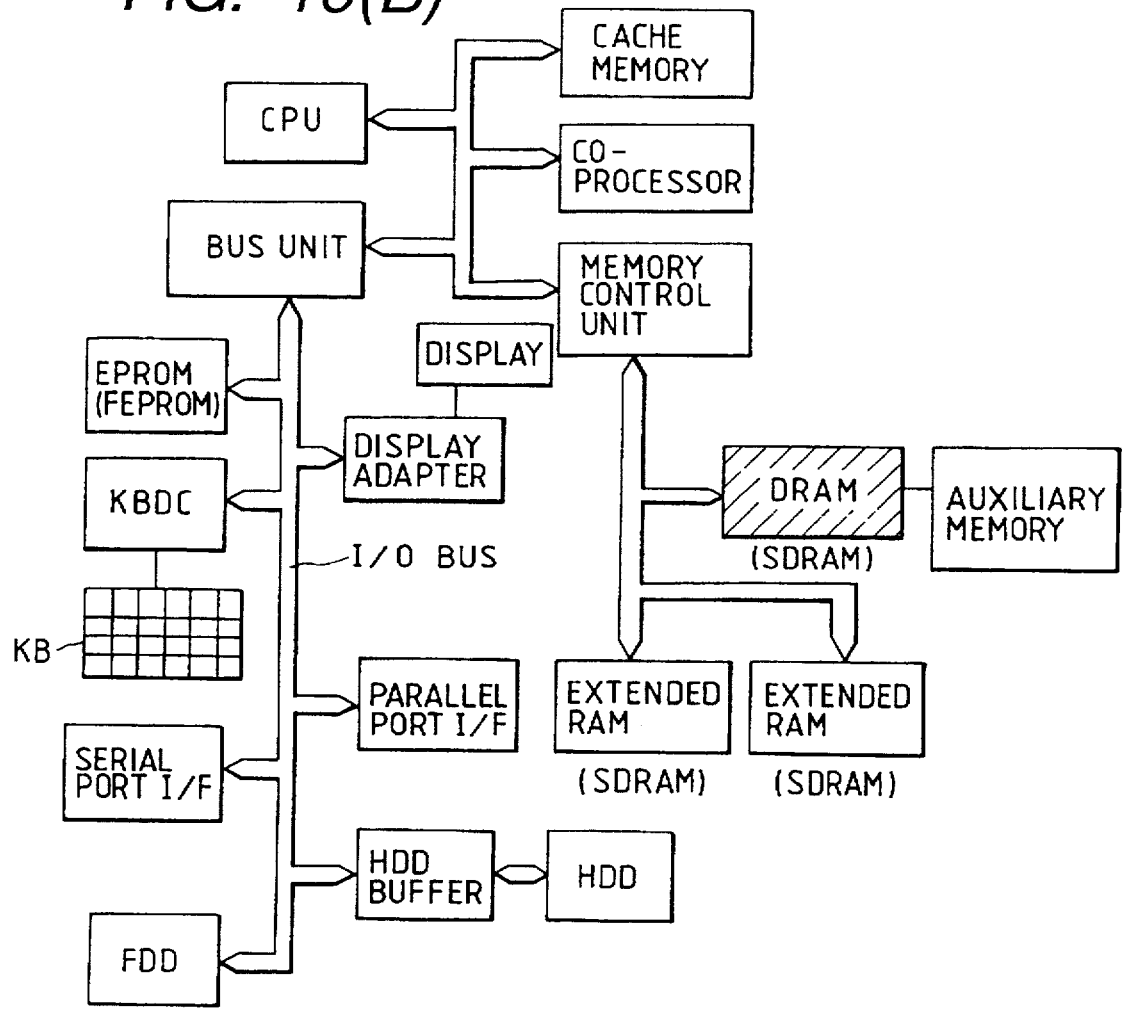

FIGS. 16(A) and 16(B) show block diagrams of an embodiment of a personal computer system using an SDRAM to which the present invention is applied. FIG. 16(A) shows a schematic view of the essential portion of the system and FIG. 16(B) shows a block diagram of the system.

The system comprises a built-in floppy disk drive, a file memory fileM using the DRAM to which the present invention is applied as a main memory, and an SRAM serving as a battery backup. Moreover, the input/output units use a keyboard KB and a display DP and a floppy disk FD is inserted into the floppy disk drive. Thereby, the system functions as a desk-top personal computer capable of storing information in the floppy disk FD serving as software and the file memory fileM serving as hardware.

In the case of this embodiment, though a case is described in which the present invention is applied to a desk-top personal computer, the present invention can also be applied to a notebook-size personal computer. Moreover, though a floppy disk is described as an auxiliary function, the auxiliary function is not restricted to the floppy disk.

In FIG. 16(B), the personal computer of this embodiment comprises a central processing unit CPU serving as an information unit of this computer, an I/O bus formed in the information processing system, a bus unit, a memory control unit for accessing a high-speed memory such as a main memory or extended memory, a DRAM (SDRAM) and an extended RAM (SDRAM) of the present invention serving as a main memory, an EPROM (flash EPROM) storing a basic control program and the like, and a keyboard controller KBDC to whose front end a keyboard is connected.

A display adapter is connected to an I/O bus and a display is connected to the front end of the display adapter. Moreover, the I/O bus connects with a parallel port I/F, a serial port I/F such as a mouse, a floppy disk drive FDD, and a buffer-controller HDD buffer for converting into an HDD I/F from the I/O bus. Moreover, the I/O bus connects with a bus extended from the memory control unit and with an extended RAM and an SDRAM of the present invention serving as a main memory. Though the extended RAM is not restricted, it comprises the SDRAM of the present invention.

The outline of operations of the personal computer system is described below. When a power supply is turned on and operations start, the central processing unit CPU first accesses the ROM through the I/O bus to perform initial diagnosis and initialization. Then, the CPU loads a system program in the DRAM of the present invention serving as a main memory from an auxiliary memory. The central processing unit CPU operates so as to make an HDD controller access an HDD through the I/O bus. When loading of the system program is completed, the CPU progresses processings in accordance with user's processing requests.

A user progresses operations while inputting or outputting processings by the keyboard controller KBDC on the I/O bus and the display adapter. Then, the user effectively uses input/output devices connected to the parallel port I/F and the serial port I/F. When the main storage capacity of the SDRAM of the present invention serving as a main memory of the body is insufficient, the shortage of the capacity is compensated with the extended RAM. Moreover, though the hard disk drive HDD is used in FIG. 16(B), it is possible to replace it with a flash file using a flash memory FEPROM.

In the case of the above microcomputer system, a bus connected with the central processing unit CPU and a bus connected with the control unit DRAM (SDRAM) comprise the GTL respectively. Moreover, these buses are constituted so as to transfer signals to and from external units synchronously with a clock and various signals input to their interface synchronously with a clock signal like the case of the embodiment are intermittently operated in accordance with the clock signal so as to decrease power consumption.

Figure 17:
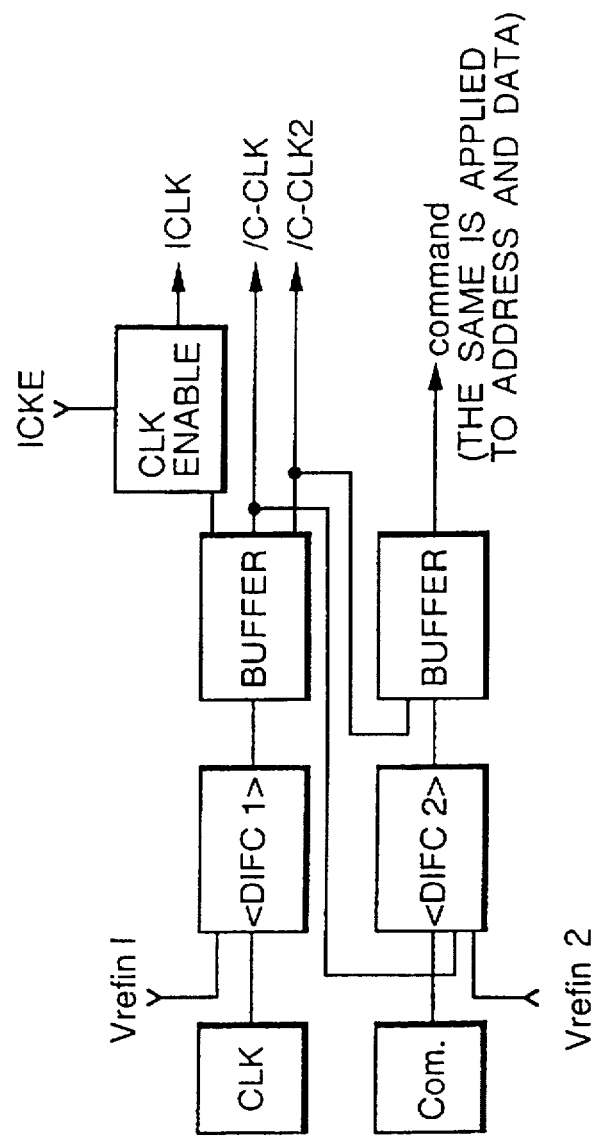
FIG. 17 shows an arrangement wherein two reference voltages are respectively applied to the two input circuits.

FIG. 17 shows an alternative embodiment similar to FIG. 1, except for the fact that two reference voltages Vrefin 1 and Vrefin 2 are provided, respectively, to the input circuits DIFC 1 and DIFC 2. The reference voltage Vrefin 1 preferably has a middle potential set between a high and low level of the external clock signal applied to the terminal CLK while the reference voltage Vrefin 2 preferably has a middle potential between high and low levels of the external address signal applied to the external terminal COM.

The following are functions and advantages obtained from the embodiment. That is:

(1) In the case of a semiconductor integrated circuit device having a low-amplitude input/output interface constituted so as to input or output a signal synchronously with a clock signal and transfer a signal with a low amplitude for a power supply voltage to and from an external unit, an advantage is obtained that an input circuit applicable to a small signal and greatly decreasing its current consumption can be obtained by using a differential circuit to be practically and continuously operated as an input circuit for receiving a signal supplied from an external unit and moreover, using a differential circuit to be intermittently operated in accordance with the clock signal and capable of sampling captured internal signals while it is operated and holding the sampled signals while it is not operated as an input circuit for receiving a small signal inputted synchronously with the clock signal.

(2) In the case of the semiconductor integrated circuit device in the above Item (1), an advantage is obtained that power consumption can be decreased in a no-operation mode in which no operation is performed by turning off a current source MOSFET constituting the above first input circuit and a current source MOSFET constituting the above second input circuit.

(3) By using a first transmission gate circuit to be turned on in the first half of an input capture control signal to capture the low-amplitude input signal and a reference voltage set to the middle voltage of the input signal as the above second input circuit, a latch circuit comprising a CMOS inverter circuit in which an input and output are intersected and connected to a pair of nodes corresponding to the input signal and the reference voltage, a precharge circuit for shorting the both nodes to supply a precharge voltage corresponding to the reference voltage before the input capture signal is generated, and a second transmission gate circuit to be turned on in the second half of the input capture control signal to transfer an output signal of the latch circuit to an internal circuit, an advantage is obtained that a high-sensitivity and low-power-consumption input circuit having a latching function can be obtained.

(4) By using a first transmission gate circuit to be turned on in the first half of an input capture control signal to capture the low-amplitude input signal and a reference voltage set to the middle potential of the input signal, a differential MOSFET of a first conductivity type whose gate is connected to a pair of nodes corresponding to the input signal and the reference voltage, a load MOSFET of a second conductivity type which is set at the drain side of the differential MOSFET of the first conductivity type and whose gate and drain are intersected and connected to each other, a precharge circuit for shorting a pair of output nodes connecting with the drains of the differential MOSFET of the first conductivity type and the load MOSFET of the second conductivity type and supplying a precharge voltage corresponding to the reference voltage before the input capture signal is generated, and a second transmission gate circuit to be turned on in the second half of the input capture control signal to transfer signals of both output nodes to an internal circuit, an advantage is obtained that a high-sensitivity and low-power-consumption input circuit having a latching function can be obtained.

(5) In the case of a semiconductor integrated circuit device having a low-amplitude input/output interface for inputting or outputting a signal synchronously with a clock signal and transferring a signal with a low amplitude for a power supply voltage to and from an external unit, a current mirror circuit comprising a pair of input MOSFETs of a first conductivity type in which the low-amplitude input signal and a reference voltage set to about the middle potential of the amplitude of the input signal are supplied between the gate and the source and a MOSFET of a second conductivity type set to the drains of the both input MOSFETs to supply a current corresponding to the drain current of one input MOSFET to the drain of the other input MOSFET and a current source MOSFET for supplying an operating current to the source of the MOSFET of the second conductivity type constituting the current mirror circuit are used to continuously operate a device for receiving a clock signal and intermittently operate a device for receiving an input signal synchronizing with the clock signal. According to this structure, because an input signal is supplied between the gate and the source of a MOSFET, an advantage is obtained that a signal whose small-amplitude level is deflected to the circuit ground potential side or the power supply voltage side can be operated.

(6) In the case of the semiconductor integrated circuit device in the above Item (5), an advantage is obtained that power consumption can be decreased in a no-operation mode in which no operation is performed by turning off the current source MOSFET in the no-operation mode.

(7) By applying the present invention to a synchronous dynamic RAM, an advantage is obtained that a low-amplitude interface such as a GTL can be realized while decreasing power consumption.

(8) By using a pair of differential MOSFETs whose gates receive an external clock signal supplied from the outside of a semiconductor integrated circuit device and a first reference voltage set to about the middle potential of the amplitude of the external clock signal, a current source circuit for supplying current to each source-drain route of both differential MOSFETs, a first input circuit for generating an internal clock signal having an amplitude larger than that of the external clock signal, and a latch circuit for receiving an external input signal supplied from the outside of the semiconductor integrated circuit device, a second reference voltage set to about the middle potential of the amplitude of the external input signal, and a control signal responding to the external clock signal and latching the external input signal in accordance with the control signal; and by using a second input circuit for generating an internal signal having an amplitude larger than that of the input signal for the latch circuit, an advantage is obtained that a semiconductor integrated circuit device having an input circuit applicable to a small signal and greatly decreasing its current consumption can be obtained.

The invention made by the present inventor is specifically described in accordance with the various embodiment noted above. However, the invention of the present application is not restricted to these embodiments. It is needless to say that various modifications of the present invention are allowed as long as they do not deviate from the gist of the present invention. For example, it is possible to input or output data not only every 8 bits but also every 16 bits in an SDRAM, if so desired. Moreover, it is possible to apply various embodiments to address assignment correspondingly to the number of data bits or a storage capacity. The present invention can widely be applied to various types of semiconductor integrated circuit device in which an input signal is captured synchronously with a clock signal.

Functions obtained from a typical invention among the inventions disclosed in the present application are briefly described below. That is, in the case of a semiconductor integrated circuit device having a low-amplitude input/output interface constituted so as to input or output a signal synchronously with a clock signal and transfer a signal with a low amplitude for a power supply voltage to and from an external unit, an input circuit applicable to a small signal and greatly decreasing its current consumption can be obtained by using a differential circuit to be practically and continuously operated as an input circuit for receiving a signal supplied from an external unit and moreover, using a differential circuit to be intermittently operated in accordance with the clock signal and capable of sampling captured internal signals while it is operated and holding the sampled signals while it is not operated as an input circuit for receiving a small signal inputted synchronously with the clock signal.

According to the above semiconductor integrated circuit device, it is possible to decrease power consumption in a no-operation mode in which no operation is performed by turning off the current source MOSFET constituting the above first input circuit and the current source MOSFET constituting the second input circuit in the no-operation mode.

By using a first transmission gate circuit to be turned on in the first half of an input capture control signal to capture the small input signal and a reference voltage set to the middle voltage of the input signal as the above second input circuit, a latch circuit comprising a CMOS inverter circuit in which an input and output are intersected and connected to a pair of nodes corresponding to the input signal and the reference voltage, a precharge circuit for shorting both nodes to supply a precharge voltage corresponding to the reference voltage before the input capture signal is generated, and a second transmission gate circuit to be turned on in the second half of the input capture control signal to transfer an output signal of the latch circuit to an internal circuit, a high-sensitivity and low-power-consumption input circuit having a latching function can be obtained.

By using a first transmission gate circuit to be turned on in the first half of an input capture control signal to capture the small input signal and a reference voltage set to the middle potential of the input signal, a differential MOSFET of a first conductivity type whose gate is connected to a pair of nodes corresponding to the input signal and the reference voltage, a load MOSFET of a second conductivity type which is set at the drain side of the differential of the first conductivity type MOSFET and whose gate and drain are intersected and connected to each other, a precharge circuit for shorting a pair of output nodes connecting with the drains of the differential MOSFET of the first conductivity type and the load MOSFET of the second conductivity type and supplying a precharge voltage corresponding to the reference voltage before the input capture signal is generated, and a second transmission gate circuit to be turned on in the second half of the input capture control signal to transfer signals of the both output nodes to an internal circuit, a high-sensitivity and low-power-consumption input circuit having a latching function can be obtained.

In the case of a semiconductor integrated circuit device having a low-amplitude input/output interface for inputting or outputting a signal synchronously with a clock signal and transferring a signal with a small amplitude for a power supply voltage to and from an external unit, a current mirror circuit comprising a pair of input MOSFETs of a first conductivity type in which the small input signal and a reference voltage set to about the middle potential of the amplitude of the input signal are supplied between the gate and the source and a MOSFET of a second conductivity type set to the drains of the both input MOSFETs to supply a current corresponding to the drain current of one input MOSFET to the drain of the other input MOSFET and a current source MOSFET for supplying an operating current to the source of the MOSFET of the second conductivity type constituting the current mirror circuit are used to continuously operate a device for receiving a clock signal and intermittently operate a device for receiving an input signal synchronizing with the clock signal. According to this structure, because an input signal is supplied between the gate and the source of a MOSFET, a signal whose low level is deflected to the circuit ground potential side or the power supply voltage side can be operated.

In the case of the above semiconductor integrated circuit device, it is possible to decrease power consumption in a no-operation mode in which no operation is performed by turning off the current source MOSFET in the no-operation mode.

By applying the present invention to a synchronous dynamic RAM, it is possible to realize a low-amplitude interface such as a GTL while decreasing power consumption.

By using a pair of differential MOSFETs whose gates receive an external clock signal supplied from the outside of a semiconductor integrated circuit device and a first reference voltage set to about the middle potential of the amplitude of the external clock signal, a current source circuit for supplying current to each source-drain route of both differential MOSFETs, a first input circuit for generating an internal clock signal having an amplitude larger than that of the external clock signal, and a latch circuit for receiving an external input signal supplied from the outside of the semiconductor integrated circuit device, a second reference voltage set to about the middle potential of the amplitude of the external input signal, and a control signal responding to the external clock signal and latching the external input signal in accordance with the control signal; and by using a second input circuit for generating an internal signal having an amplitude larger than that of the input signal for the latch circuit, a semiconductor integrated circuit device having an input circuit applicable to a small signal and greatly decreasing its current consumption can be obtained.

We claim:

1. A semiconductor integrated circuit device comprising:
   a first input circuit which receives a low amplitude external clock signal supplied from an external clock unit, said first input circuit including a first differential circuit having a first input which receives the low-amplitude external clock signal and a second input which receives a first reference voltage set to about a middle potential between a high level and a low level of said external clock signal and a current source which is coupled to the first differential circuit, wherein the first differential circuit substantially continuously operates to generate a low-amplitude internal clock signal with an amplitude corresponding to a power supply voltage, and
   a second input circuit which receives a low-amplitude external input signal inputted synchronously with the low amplitude external clock signal, including a second differential circuit having a first input which receives the low-amplitude external input signal and a second input which receives a second reference voltage set to about a middle potential between a high level and a low level of said low amplitude external input signal, a second current source which is coupled to the second differential circuit, wherein the second input circuit is intermittently operated in accordance with the low-amplitude internal clock signal generated by the first input circuit, wherein the second differential circuit is an input section which generates a low-amplitude internal input signal with an amplitude corresponding to the power supply voltage, and a buffer circuit which samples the low-amplitude internal input signal generated by the input section in accordance with the internal clock signal while the input section is operated and which holds the sampled signal while the input section is not operated.

2. A semiconductor integrated circuit device comprising a first input circuit and a second input circuit, wherein said first input circuit comprises:

a pair of first MOSFETs each having a gate which respectively receive external clock signals being supplied from an outside of said semiconductor integrated circuit device and a first reference voltage, said first reference voltage being substantially a middle potential between a high level and a low level of said external clock signals;

a first load circuit coupled to source-drain paths of said pair of first MOSFETs; and a first current source circuit coupled to said source-drain paths of said pair of first MOSFETs, wherein said first input circuit outputs internal clock signals based on said external clock signals, an amplitude of said internal clock signals being larger than an amplitude of said external clock signals, wherein said second input circuit comprises:

a pair of second MOSFETs each having a gate which respectively receive input signals being supplied from said outside of said semiconductor integrated circuit device and a second reference voltage, said second reference voltage being substantially a middle potential between a high level and a low level of said input signals;

a second load circuit coupled to source-drain paths of said pair of second MOSFETs; and a second current source circuit coupled to said source-drain path of said pair of second MOSFETs, wherein said second input circuit is operated in response to said internal clock signals, and generates internal signals based on said input signals, an amplitude of said internal signals being larger than an amplitude of said input signals.

3. The semiconductor integrated circuit device according to claim 2, wherein said first current source circuit comprises a MOSFET having a source-drain path coupled to said source-drain paths of said pair of first MOSFETs, and wherein said second current source circuit comprises another MOSFET having a source-drain path coupled to said source-drain paths of said pair of second MOSFETs.

4. The semiconductor integrated circuit device according to claim 3, wherein the semiconductor integrated circuit device constitutes a synchronous dynamic RAM, wherein said second input circuit is an input circuit for address input signals, or data input signals.

5. A semiconductor integrated circuit device comprising a first input circuit and a second input circuit, wherein said first input circuit comprises:

a pair of first MOSFETs each having a gate which respectively receive external clock signals being supplied from an outside of said semiconductor integrated circuit device and a first reference voltage, said first reference voltage being substantially a middle potential between a high level and a low level of said external clock signals:

a first load circuit coupled to source-drain paths of said pair of first MOSFETs; and a first current source circuit coupled to said source-drain paths of said pair of first MOSFETs, wherein said first input circuit outputs internal clock signals based on said external clock signals, an amplitude of said internal clock signals being larger than an amplitude of said external clock signals, wherein said second input circuit includes a latch circuit which receives input signals supplied from the outside of said semiconductor integrated circuit device, a second reference voltage which is substantially a middle potential between a high level and a low level of said input signals, and control signals which responds to said internal clock signals and which latches said input signals in accordance with said control signals, wherein said latch circuit generates internal signals having an amplitude larger than an amplitude of said input signals.

6. The semiconductor integrated circuit device according to claim 5, further comprising an internal circuit, wherein said internal signals generated by said latch circuit are complementary signals, and wherein said latch circuit has a first terminal and a second terminal for outputting said complementary signals, respectively, and wherein said second input circuit further includes:

a pair of signal lines connected to said first terminal and the second terminal of said latch circuit;

a first transmission circuit which transmits said input signals and said second reference voltage to each of said pair of signal lines;

a second transmission circuit which transmits potentials of said pair of signal lines to said internal circuit; and a precharge circuit which precharges said second reference voltage to said pair of signal lines.

7. The semiconductor integrated circuit device according to claim 6, wherein said control signals include:

a first pulse signal generated in response to a change of said internal clock signals from a first level to a second level; and a second pulse signal which responds to a change of said external clock signals from said first level to said second level, said second pulse signal being generated after said first pulse signal is generated, wherein said first transmission circuit becomes conductive in response to said first pulse signal, wherein said second transmission circuit becomes conductive in response to said second pulse signal.

8. The semiconductor integrated circuit device according to claim 7, wherein said control signals further include a third pulse signal generated in response to the fact that said external clock signal is set to said first level, and wherein said precharge circuit supplies said second reference voltage to said pair of signal lines responding to said third pulse signal.

9. The semiconductor integrated circuit device according to claim 7, wherein said first transmission circuit includes:

a third terminal which receives said input signals;

a fourth terminal which receives said second reference voltage;

a first MOSFET having a source-drain path coupled between said third terminal and one of said pair of signal lines and having a gate which receives said first pulse signal:

a second MOSFET having a source-drain path coupled between said fourth terminal and the other of said pair of signal lines and having a gate which receives said first pulse signal, wherein said second transmission circuit includes;

a third MOSFET having a source-drain path coupled between the one of said pair of signal lines and said internal circuit and having a gate which receives said second pulse signal; and a fourth MOSFET having a source-drain path coupled between the other of said pair of signal lines and said internal circuit and having a gate which receives said second pulse signal, wherein said precharge circuit includes:

a fifth MOSFET having a source-drain path coupled between the one of said pair of signal lines and said second reference voltage and having a gate which receives said third pulse signal:

a sixth MOSFET having a source-drain path coupled between the other of said pair of signal lines and said second reference voltage and having a gate receiving said third pulse signal; and a seventh MOSFET having a source-drain path coupled between said pair of signal lines and having a gate which receives said third pulse signal, and wherein said latch circuit includes:

a first CMOS inverter having an input terminal connected to said first terminal and an output terminal connected to said second terminal; and a second CMOS inverter having an output terminal connected to said input terminal of the first CMOS inverter and an input terminal connected to said output terminal of the first CMOS inverter.

10. A semiconductor integrated circuit device comprising a first input and a second input circuit, wherein said first input circuit comprising:

a pair of first MOSFETs each having a gate which respectively receives external clock signals being supplied from an outside of said semiconductor integrated circuit device and a first reference voltage, said first reference voltage being substantially a middle potential between a high level and a low level of said external clock signals;

a first load circuit coupled to source-drain paths of said pair of first MOSFETs; and a first current source circuit coupled to said source-drain paths of said pair of first MOSFETs, wherein said first input circuit outputs internal clock signals based on said external clock signals, an amplitude of said internal clock signals being larger than an amplitude of said external clock signals, wherein said second input circuit receives input signals supplied from said outside of the semiconductor integrated circuit device, a second reference voltage which is substantially a middle potential between a high level and a low level of said input signals, and said internal clock signals and generates internal signals having an amplitude larger than an amplitude of said input signals, and wherein said second input circuit is operated in response to said internal clock signals.

11. The semiconductor integrated circuit device according to claim 10, wherein said second input circuit includes:

a pair of second MOSFETs each having a gate which respectively receives said input signals and said second reference voltage;

a second load circuit coupled to source-drain paths of said pair of second MOSFETs; and a second current source circuit coupled to said source-drain paths of said pair of second MOSFETs.

12. The semiconductor integrated circuit device according to claim 11, wherein said second current source circuit includes a MOSFET which is turned on in response to said internal clock signals.

* * * * *